(12) United States Patent
Hariton et al.

(10) Patent No.: US 7,679,464 B2
(45) Date of Patent: Mar. 16, 2010

(54) METHOD AND APPARATUS FOR FREQUENCY MODULATING A PERIODIC SIGNAL OF VARYING DUTY CYCLE

(76) Inventors: Dan Ion Hariton, 2725 Garrity Ct., Pinole, CA (US) 94564; Narendar Venugopal, Alliance Semiconductor, 2575 Augustine Dr., Santa Clara, CA (US) 95054

( * ) Notice: Subject to any disclaimer, the term of this patent is extended or adjusted under 35 U.S.C. 154(b) by 72 days.

(21) Appl. No.: 12/074,459

(22) Filed: Mar. 3, 2008

(65) Prior Publication Data

US 2008/0157894 A1 Jul. 3, 2008

Related U.S. Application Data

(62) Division of application No. 11/115,550, filed on Apr. 26, 2005, now Pat. No. 7,561,002.

(51) Int. Cl.
*H03K 3/02* (2006.01)
*H03K 7/08* (2006.01)

(52) U.S. Cl. .................. 331/111; 331/143; 332/109; 332/119; 332/123; 323/288

(58) Field of Classification Search ............ 331/111, 331/143, 150, 46, 47, 178; 332/117, 119, 332/109, 123; 375/130, FOR. 100, E1.001; 323/282, 288
See application file for complete search history.

(56) References Cited

U.S. PATENT DOCUMENTS

| | | | | |
|---|---|---|---|---|
| 3,700,869 | A * | 10/1972 | Low et al. | ............ 708/252 |
| 6,969,978 | B2 * | 11/2005 | Dening | ............ 323/282 |
| 7,208,926 | B2 * | 4/2007 | Mitsuo | ............ 323/282 |
| 2004/0041604 | A1 * | 3/2004 | Kizer et al. | ............ 327/157 |

* cited by examiner

*Primary Examiner*—Robert Pascal
*Assistant Examiner*—Ryan J Johnson
(74) *Attorney, Agent, or Firm*—Harris Zimmerman; Howard Cohen

(57) ABSTRACT

A method and apparatus for frequency modulating a PWM involves 1) generating a high frequency carrier signal much greater in frequency than the PWM signal; 2) modulating the high frequency signal to generate a spread spectrum carrier signal; and, 3) retiming a PWM signal with this high frequency SS carrier signal so that the binary transitions of the PWM signal are aligned with the frequency varying carrier signal. In another embodiment, a PWM oscillator is driven by a second, FM oscillator having spread spectrum characteristics. In another embodiment a PWM oscillator is driven and modulated by a counter/frequency divider comprised of modules.

17 Claims, 25 Drawing Sheets

PWM waveform no Modulation

PWM Spectrum no Modulation

Spectrum of PWM waveform without Spread Spectrum

Spectrum of PWM waveform with Spread Spectrum (duty cycle is preserved).

Adaptive Retiming at 2X Nyquist Rate

The sampling frequency $F_1$ increases (N increases) to detect narrower PWM cycles Safety margin assured by $F_2 = F_1 / 2$ detecting narrower PWM cycles $F_1$ increase is capped by forcing $F_4 = F_1 / 4$ to miss narrower PWM cycles

METHOD AND APPARATUS FOR FREQUENCY MODULATING A PERIODIC SIGNAL OF VARYING DUTY CYCLE

CROSS-REFERENCE TO RELATED APPLICATIONS

This application is a divisional application of patent application Ser. No. 11/115,550, filed Apr. 26, 2005, now U.S. Pat. No. 7,561,002 for which priority is claimed.

FEDERALLY SPONSORED RESEARCH

Not applicable.

SEQUENCE LISTING, ETC ON CD

Not applicable.

BACKGROUND OF THE INVENTION

1. Field of the Invention

The present invention generally, relates to the reduction of EMI in systems using a Pulse Width Modulated (PWM) signal. A PWM signal is defined as a periodic signal in which the duty cycle or pulse width may vary from one cycle to another. PWM signals are used in numerous applications such as motor drive control, error sensing and power supply design.

2. Description of Related Art

EMI (electromagnetic interference) is the generation of undesired radiation energy which has the potential of interfering with the operation of electronic systems. Regulatory bodies exist in most countries to set standards and guidelines for EMI and these bodies also monitor emissions by industrial, commercial and domestic systems to ensure compliance.

Numerous articles in the prior art describe methods of generating periodic frequency modulated signals. This patent specifically addresses the area of reconstruction of a PWM signal, which carries certain information content embedded within the signal (and represented by the pulse width or duty cycle of the pulse) while adding frequency modulation. Thus the new FM modulated PWM signal retains a significant percentage of the original information, which may be recovered by the system and used as if the FM component had never been added. This may be achieved in many ways and this patent illustrates four embodiments but is not restricted to these alone. The percentage of error in the reconstructed signal is directly related to the ratio between the minimum pulse width (smallest duty cycle) of the PWM and the carrier frequency used to perform the modulation. This relationship is described in the following specification.

Due to the nature of the PWM signal it is not a trivial task to frequency modulate the signal and retain at least a significant portion of the original information present in the PWM signal. This is because the information present in the PWM signal is contained in the pulse width of the pulse train on a per cycle basis. Conventional and widely accepted methods of frequency modulation are capable of generating a signal which has the same period as the original signal but cannot replicate the varying pulse width on a per cycle basis. As an illustration, a well known FM method is to use a phase locked loop (PLL) to directly or indirectly receive the signal to be modulated and then modulate the loop in one of many methods. The final modulated signal is derived from the frequency generating element of the PLL (the voltage controlled oscillator or current controlled oscillator) and the final duty cycle is usually constant and a reflection of this PLL element rather than of the original incoming signal having varying duty cycle.

U.S. Pat. No. 6,366,067 describes a system for reducing EMI in a power supply. It uses a PWM to generate a switching signal at a modulated frequency. It does not use the term "spread spectrum," but it is modulated over a "selected spread of frequencies." It is significant that there is no disclosure regarding the means for applying frequency modulation to the PWM signal.

It appears that attempts to apply spread spectrum techniques to PWM tend to alter the pulse width characteristics on a per cycle basis, due to the shifting frequency of the pulse signal. This alteration may introduce unwanted signal or voltage levels in the output, and an arrangement to avoid this problem would be a welcome innovation in the art.

BRIEF SUMMARY OF THE INVENTION

The present invention generally comprises a method and apparatus for frequency modulating a periodic signal of varying duty cycle. More specifically, the invention frequency modulates a PWM signal to spread the frequency of the PWM and reduce the magnitude of spectral components of the PWM.

One embodiment of the invention involves a method that includes the steps of: 1) generating a high frequency carrier signal much greater in frequency than the PWM signal; 2) modulating the high frequency signal by any one of the many known methods to generate a spread spectrum carrier signal; and, 3) retiming a PWM signal with this high frequency SS carrier signal. That is, the binary transitions of the PWM signal are thus aligned with the frequency varying carrier signal, causing the spectral components of the PWM signal to be diffused and reduced in magnitude. A significant outcome of this process is that the pulse width of the PWM signal is not altered in any significant way, on a per cycle basis, so that the PWM characteristics and information content are maintained. Thus, for example, a desired duty cycle may be preserved, even though the PWM signal is spread and EMI is attenuated.

The system is comprised of:

1) A level shifter to shift the voltage of the incoming PWM signal down to a new operational voltage range between Vdd and Vgnd.
2) A frequency modulation circuit that generates a frequency modulated reconstruction signal;
3) A reconstruction and retiming circuit, which accepts the incoming PWM signal, detects the edge transitions and resynchronizes its transitions (rising and falling edges) to the modulated carrier frequency.

The retiming and reconstruction circuitry may be comprised of one or more retiming elements clocked by the frequency modulated carrier. The inputs to the retiming circuit are the PWM signal and the frequency modulated carrier. The output of this retiming circuit (the retimed PWM signal(s)) is then fed into the reconstruction circuit which may use a decision algorithm to determine the correct pulse width on a per cycle basis.

In a second embodiment, the method described above is modified somewhat with the addition of an adaptive retiming arrangement. That is, the high frequency carrier signal (hereafter the clock signal) is modified so that it tracks the PWM duty cycle. The maximum value of the instantaneous clock period is no more than one-half the width of the narrowest PWM pulse or PWM gap between pulses. Thus the clock frequency is varied, with the frequency increasing significantly when the PWM duty cycle gets very low or very high. As before, the clock signal (the carrier signal) is also frequency modulated with a spread spectrum modulation profile. The higher frequency clock signal during very high/very low PWM duty cycles enables the system to resolve rapid binary transitions in the PWM signal and apply SS-induced EMI attenuation to the PWM signal.

A third embodiment of the invention accomplishes spread spectrum frequency modulation of a PWM signal through the use of two oscillator circuits. In this embodiment, each oscillator employs a bi-directional charge pump that feeds a hysteresis comparator in a feedback loop configuration. The primary oscillator generates the PWM oscillator frequency, and has its frequency determined by an adjustable circuit component (capacitor) and by the charge pump bias current. The secondary oscillator modulates the bias current of the charge pump of the primary oscillator, thereby modulating the PWM oscillator frequency. In addition, a divide-by-N network is connected between the PWM output and the input to the charge pump of the secondary oscillator to control the FM modulation rate and provide the spread spectrum characteristic. A primary RC combination sets the PWM center frequency, and a secondary RC combination sets the SS frequency deviation (percentage deviation from center). Assuming that the two oscillator topologies are formed on the same IC and that the same component materials are used for the resistors and capacitors, the resulting SS deviation characteristics (modulation rate and frequency deviation) become independent of voltage, temperature, and manufacturing process effects.

A fourth embodiment of the invention is similar to the third embodiment in providing a primary oscillator that uses a bidirectional charge pump connected to a hysteresis comparator, with the output of the comparator connected in an I-to-V feedback loop to generate the PWM oscillator frequency. The bidirectional charge pump current source is a signal comprised of a reference current summed with the output of a feedback loop from the hysteresis comparator that is fed through a Johnson counter (in the preferred embodiment) and a current mirror that also receives the reference current processed through a modular, incremental stepped network. The only independent variable is the reference current signal. The reference current signal and the Johnson counter control the SS FM deviation, and the PWM with the Johnson counter control the SS FM modulation rate. A capacitor connected from the input of the hysteresis comparator to ground determines the PWM center frequency.

Each module in the incremental stepped network consists of a flip-flop and a unit current source, and may be programmed to generate a +1 and/or −1 incremental step. The modules are accessed in serial order, and the current provided by each module adds or subtracts from the instantaneous value of the modulation profile. Simple programming of the modules enables the generation of triangular, up-spread, down-spread, non-linear triangular, and other modulation profiles.

Note that the PWM oscillation frequency may be used to SET (turn ON) a flip-flop which is part of a known technique to construct a switch mode power conversion circuit. This flip-flop is RESET (turned OFF) by feedback loops that provide output voltage regulation and protection. The proper PWM signal width is thus formed by pulse widths that are measured beginning at each rising edge of the PWM oscillator waveform and ending when each reset signal is provided by the feedback loop.

For spectral analysis purposes and to reduce simulation intensive computation times, the third and fourth embodiments refer to the PWM oscillator frequency as being the PWM signal. To make the PWM oscillator frequency look like real system PWM signals with varying duty cycles, the PWM oscillator frequency waveform itself is being generated as a 50% and not 50% duty cycle waveform. From the spectral analysis point of view, this shortcut does not impact in any ways the harmonic content of the analyzed frequency. The objective is to measure the amount of harmonics attenuation of a PWM waveform having spread spectrum. The flip-flop, being common in switched mode voltage regulators, is therefore not shown in the block diagrams for embodiments three and four, yet it exists implicitly and attenuation has been confirmed on real silicon systems integrating the PWM frequency oscillator with SS, the flip-flop, and the feedback loops that regulate the output voltage.

BRIEF DESCRIPTION OF THE DRAWING

FIG. 21 is a graph of EMI magnitude versus frequency for a typical PWM signal with SS off and SS on.

FIG. 23 is a graph of EMI magnitude versus frequency for a typical PWM signal with SS off and SS on.

DETAILED DESCRIPTION OF THE INVENTION

The present invention generally comprises a method and apparatus for frequency modulating a periodic signal of varying duty cycle to reduce the magnitude of spectral components of the periodic signal.

Figure 1:
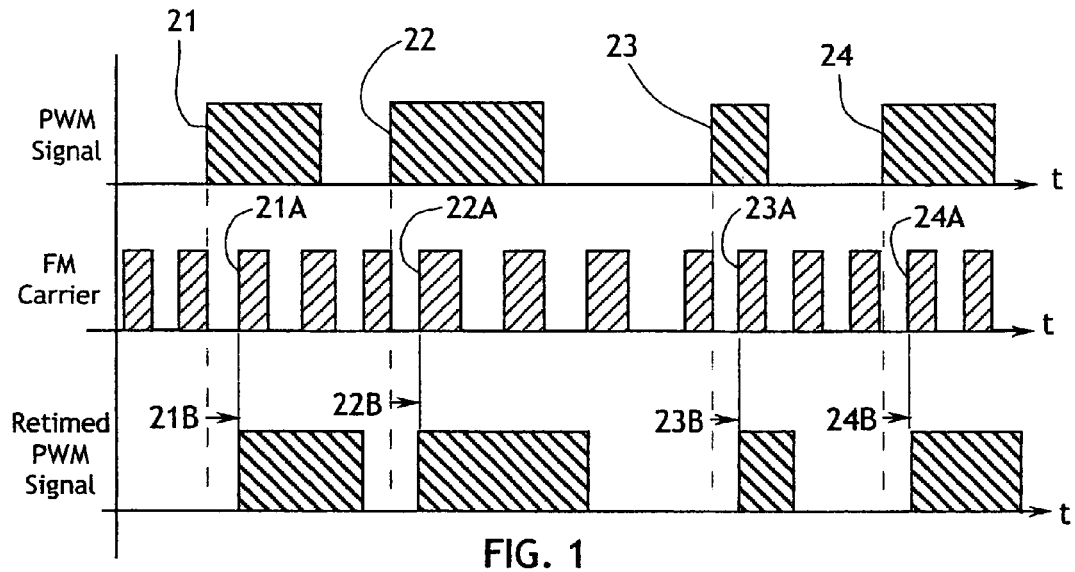
FIG. 1 is a chart depicting the signal involved in the retiming method for frequency modulating a periodic signal of the invention.

With regard to FIG. 1, one embodiment of the invention is a method including the steps of generating or acquiring a periodic signal, such as a PWM signal, as shown at the top of the figure. A PWM signal generally has a constant frequency and a variable duty cycle (pulse width). Thus the upward transition of each cycle occurs at a constant frequency, while the downward transition of each cycle depends on the pulse width of that cycle. The constant frequency of the upward transitions tends to cause a large, spike-like component in the EM spectrum of the PWM signal, a component that may comprise unacceptable electromagnetic interference.

The method also includes generating a frequency modulated carrier signal. In FIG. 1, the FM signal is a square wave that may or may not have a constant pulse width and a frequency that varies in a predetermined manner with respect to a nominal center frequency. Various methods for generating the FM carrier are described below.

The method includes the step of retiming the PWM signal in a correspondence with the FM carrier signal. In this example, the upward transition of each pulse of the PWM signal is shifted laterally along the time axis of the chart, so that it's onset is delayed to be coincident with the next upward transition of the FM carrier signal. Thus, for example, the upward PWM transition 21 is retimed to coincide with the next upward transition 21A of the FM signal, resulting in a time shift (delay) shown at 21B. Likewise, the upward transition 22 of the PWM signal is delayed to coincide with the next upward transition 22A of the FM signal, causing a time shift 22B. This process is reiterated for pulses 23, 24, and so on. It should be noted that retiming in correspondence with the frequency varying signal causes delays that are inherently varying, so that the onset of each PWM cycle is no longer occurring at a constant frequency. The PWM signal is effectively modulated by the spread spectrum of the FM carrier. Thus the spectral component associated with the upward transitions occurring at a constant frequency is attenuated to a large extent.

It is also significant that the pulse width of the retimed PWM waveform is, on a per cycle basis, substantially the same as the original PWM waveform. Thus the information content, or power density, of the PWM waveform is not altered to a significant extent. For example, a PWM signal that is controlled to vary the duty cycle of a power supply switch will deliver the desired power supply characteristics, as if it had not been modulated by the SS technique of the present invention.

The PWM signal may have the following characteristics:
1) Minimum Voltage $V_{min}$
2) Maximum Voltage $V_{max}$
3) Period $T_{PWM}$
4) Minimum pulse width $T_{PWM\_min}$ The carrier signal may have the following characteristics:
a. Carrier frequency $F_-$ and resolution of $T_-=1/F$.
b. Frequency deviation of $+/-\Delta f$
c. Modulation rate $f_m$. Modulation profile may be sinusoidal, triangular, or an arbitrary waveform.

The absolute error in reconstruction of the PWM signal is given by:

$$\epsilon = 2 \times T_{cmin} = 2 \times 1/(F_c - \Delta f)$$

The percentage of error introduced is:

$$(\epsilon/T_{PWM})*100$$

These relationships indicate that the error in signal reconstruction may be minimized by using a small minimum pulse width, or by using a high carrier frequency. Both of these techniques may be employed to optimize the method of the invention.

Figure 2:
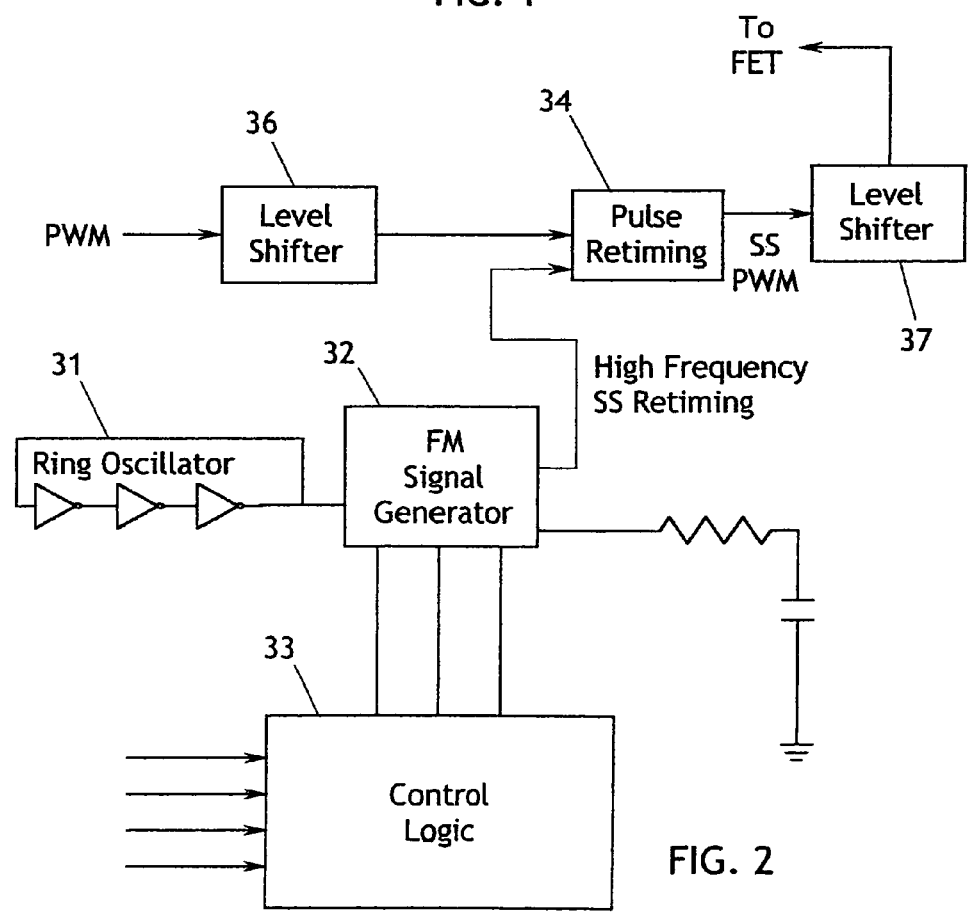
FIG. 2 is a functional block diagram depicting the apparatus of the invention for generating a frequency modulating a periodic signal of varying duty cycle.

With regard to FIG. 2, one general embodiment of the apparatus of the invention includes a signal generator 31, such as a ring oscillator or the like. The output of the signal generator 31 is fed to an FM signal generator 32, which modulates the signal from generator 31 and spreads the frequency throughout the range of $+/-\Delta f$. The FM signal generator 32 may be driven by control logic 33 to provide a frequency modulation characteristic that is known to minimize EMI, such as a triangular, sinusoidal, or parabolic FM envelope or the like. The FM signal generator may comprise a direct digital synthesis (DDS) arrangement that receives data words (coefficients) to control the modulation rate and profile, so that the modulation rate and envelope are essentially programmable. Other modulation schemes using PLL techniques and the like may also be used.

The FM signal output from generator 32 is fed to a pulse retiming circuit 34. A PWM signal, which is generated or derived from other means, also comprises an input to the pulse retiming circuit 34. The PWM signal is first conducted to a level shifting circuit 36 which modifies the voltage range of the PWM signal to be acceptable by the circuit 34. The pulse retiming circuit 34 carries out the pulse retiming task that has been depicted and described with reference to FIG. 1. The retimed PWM signal is then fed to level shifter 37 to modify its voltage range, and then is conducted to a switch such as an FET to pulse modulate an output signal. The output signal may comprise a motor control signal, a power supply signal, or the like.

Figure 3:
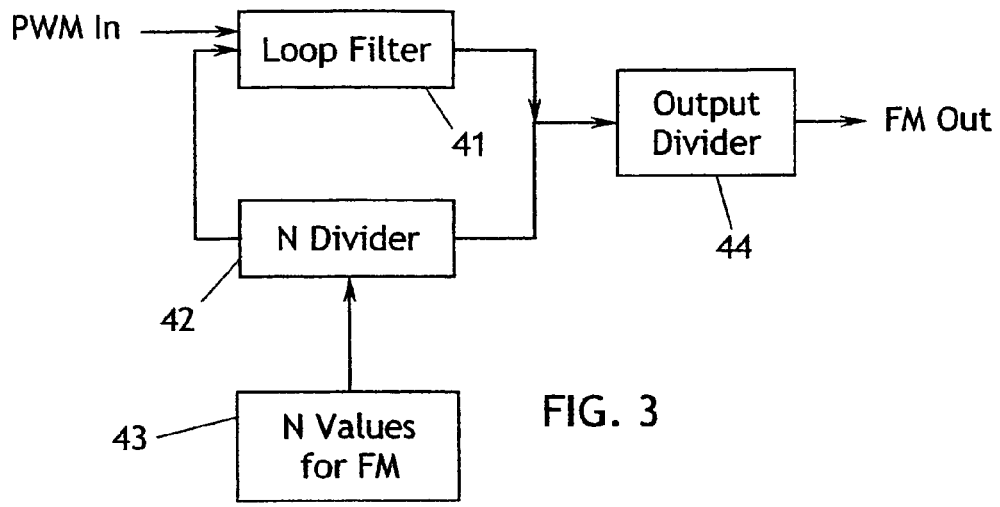
FIG. 3 is a functional block diagram of the apparatus for generating a frequency modulated signal in the present invention.

With regard to FIG. 3, another arrangement for generating an FM signal includes a PLL comprised of a loop filter 41 and an N divider 42. A memory 43 supplies N values to the N divider 42 to modulate the loop signal and control the FM rate and characteristic. The PWM signal is fed into the loop filter, so that the loop signal is set to be some varying multiple of the PWM signal frequency. The output of the loop is fed to output divider 44, which generates the FM output that is used as described above to retime the PWM signal.

Figure 4:
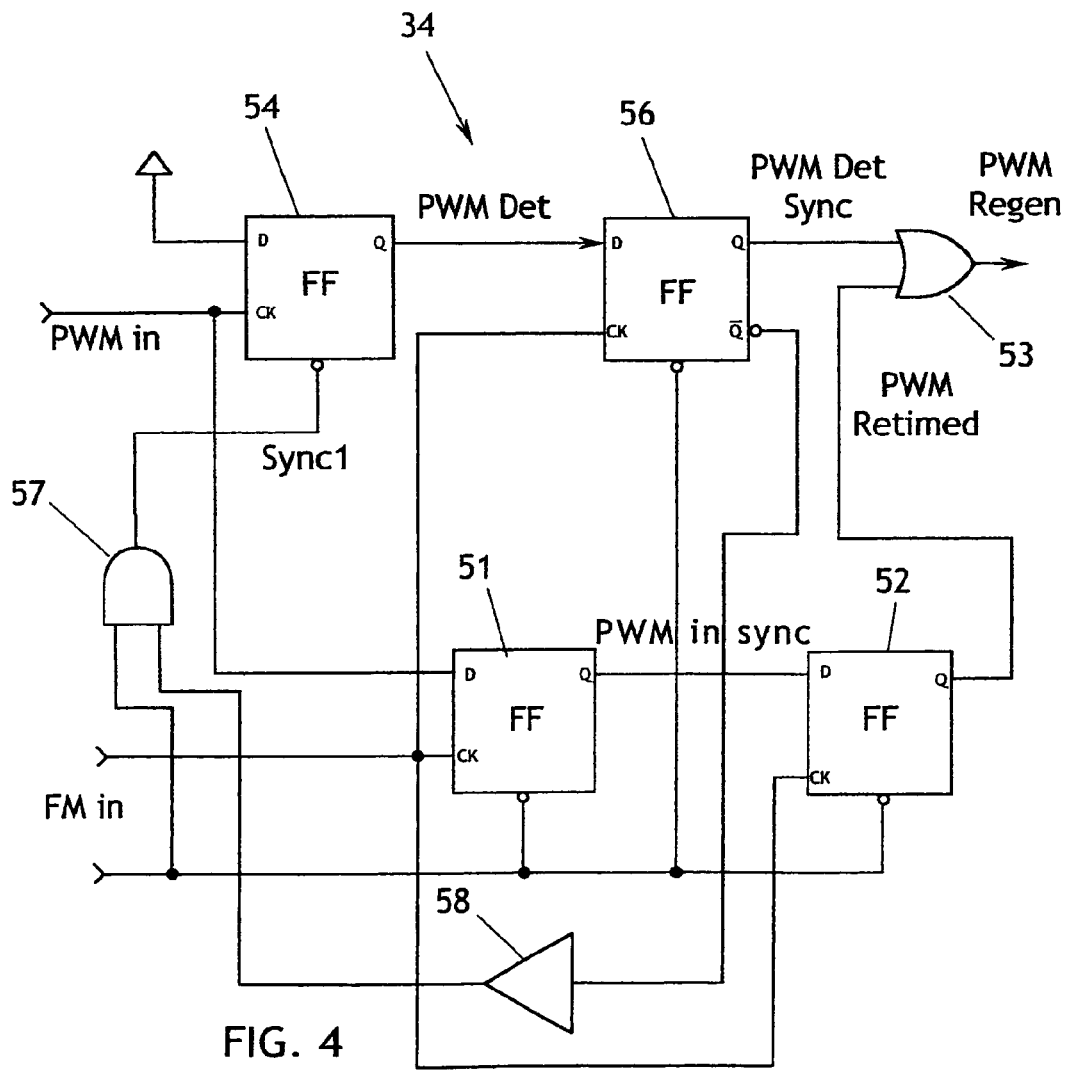
FIG. 4 is a circuit layout for retiming a PWM signal in correspondence with a frequency modulated carrier signal.

With regard to FIG. 4, one embodiment of the pulse retiming circuit 34 includes an edge detection circuit comprised of a flip-flop 51 clocked by the FM signal described previously with the D input receiving the PWM signal. The output Q is fed to another flip-flop 52, also clocked by the FM signal, which performs the same function and effectively retimes the PWM signal to the FM signal. The use of two FFs prevents metastability from occurring, so that indeterminate states are avoided. In addition, the PWM signal is fed to the clock input of FF 54, the D input being connected to ground so that FF 54 acts as an edge detector. The Q output of FF 54 is chained to the D input of FF 56, which is clocked by the FM signal, so that the edge detection occurs only during an FM pulse. An OR gate 53 receives the Q output of FF 56 and the PWM retimed signal from FF 52, and outputs the PWM regenerated signal. This latter signal is used to drive a power controlling switch such as a FET or the like. The OR gate 53, AND gate 57, and buffer amp 58 are part of a decision circuit that checks for the same output on the two flip flops 52 and 56 and then validates the final output to determine whether or not a valid transition on the PWM signal has occurred (as opposed to a glitch).

The circuit of FIG. 4 is shown as an example only. There are many equivalent circuit designs to implement the retiming function and validation function using digital logic components, gate arrays, and the like.

Figure 5:
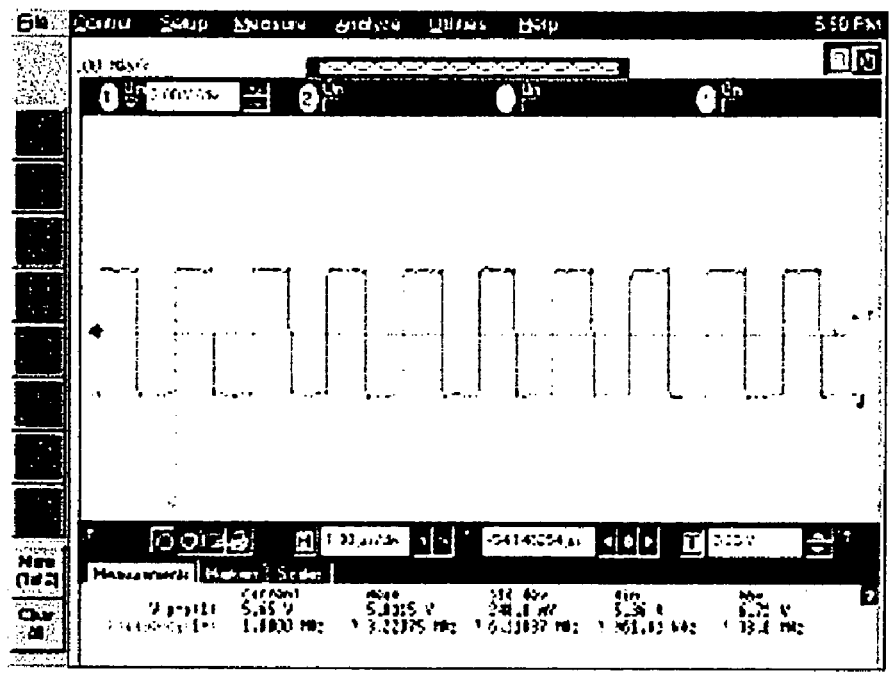
FIG. 5 is an image of a PWM waveform without frequency modulation.
Figure 6:
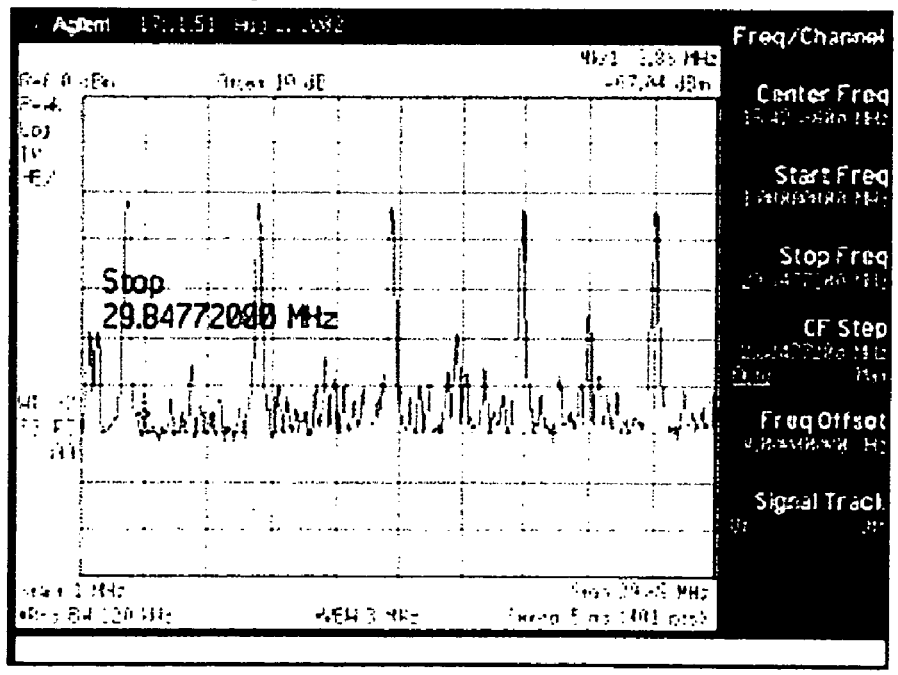
FIG. 6 is an image of the predicted EM spectrum of the PWM waveform depicted in FIG. 5.
Figure 7:
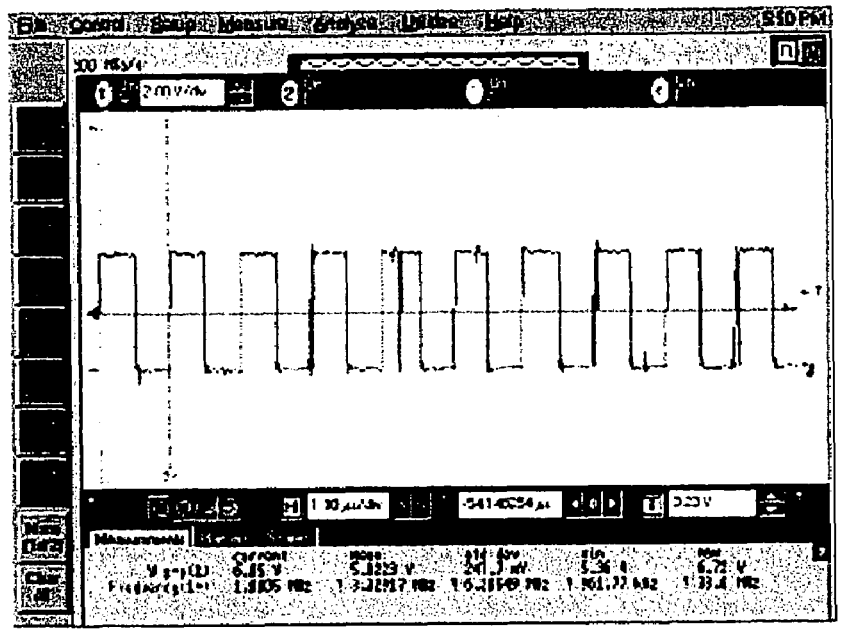
FIG. 7 is an image of a PWM waveform that is modulated in accordance with the present invention.
Figure 8:
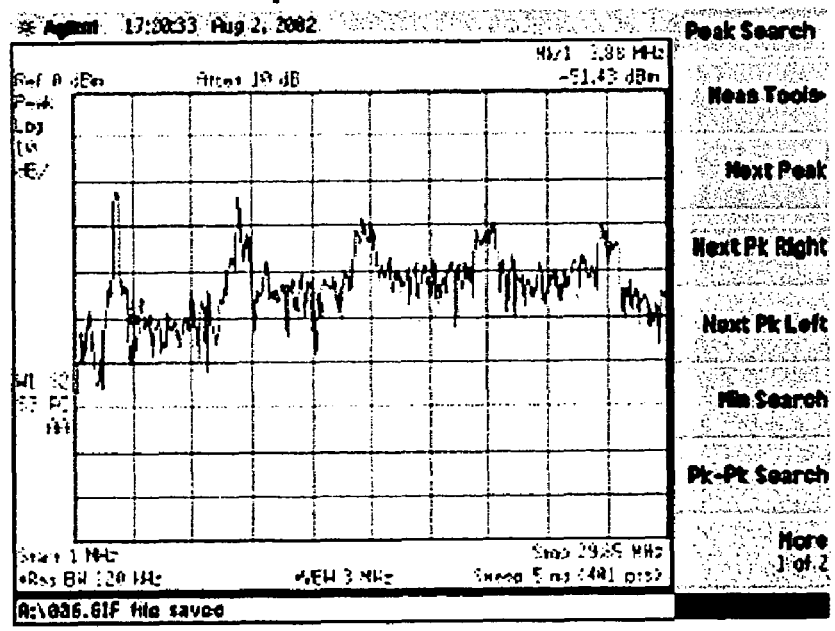
FIG. 8 is an image of the EM spectrum of the modulated PWM waveform shown in FIG. 7.

With regard to FIG. 5, a typical PWM signal is shown as an oscilloscope trace. The spectrum of that signal, shown in FIG. 6, exhibits a number of high amplitude spikes that correspond to the Fourier components resulting from the constant frequency edge transitions of the PWM signal. These high amplitude spikes are typically too large to fall within EMI standards for electronic devices. FIG. 7 shows an oscilloscope trace of a simulated PWM waveform that is modulated in accordance with the invention, and FIG. 8 depicts the spectrum of the simulated modulated PWM signal. Note that the high amplitude spikes have been reduced in amplitude and generally broadened, so that the modulated PWM signal is far more likely to generate acceptable EMI levels.

Figure 9:
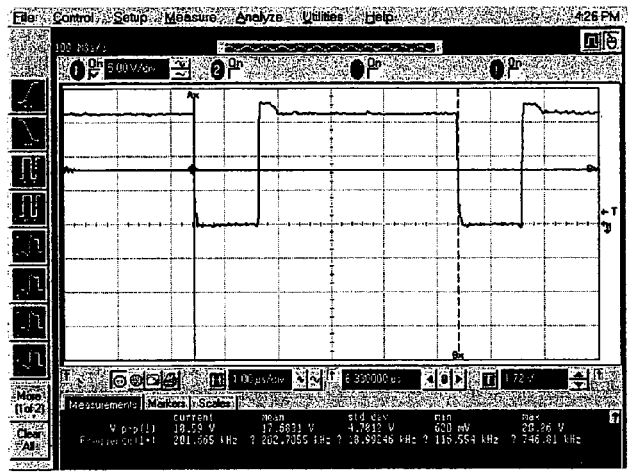
FIG. 9 is an oscilloscope image of a PWM waveform modulated in accordance with the present invention.
Figure 10:
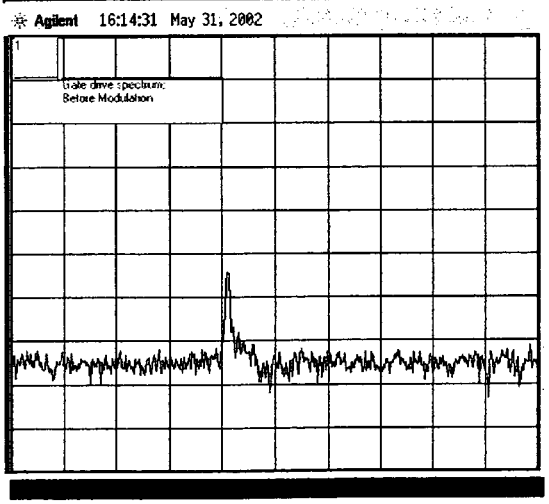
FIG. 10 is an oscilloscope measurement of the EM spectrum of an unmodulated PWM corresponding to the waveform of FIG. 9.
Figure 11:
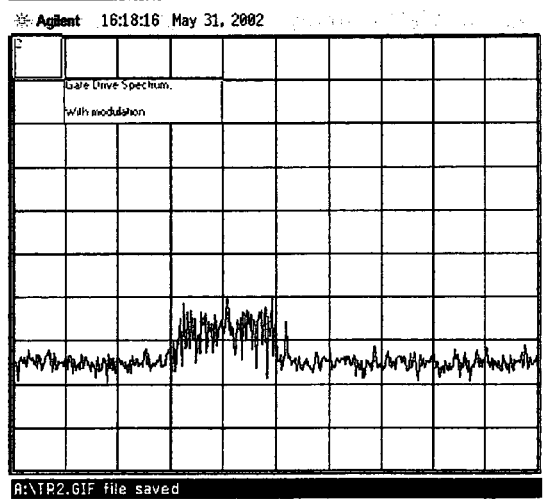
FIG. 11 is an oscilloscope measurement of the EM spectrum of the modulated waveform of FIG. 9.

FIG. 9 depicts an oscilloscope trace of the spectrum of another PWM signal that is not modulated in spread spectrum fashion. FIG. 10 depicts the spectrum of the PWM signal of FIG. 9, and FIG. 11 depicts the spectrum after FM SS modulation has been applied as described above. The beneficial results are clearly evident, in that the large noise spike of FIG. 10 has been substantially reduced and spread in FIG. 11, thereby reducing the noise magnitude (EMI) created by the PWM signal.

Figure 12:
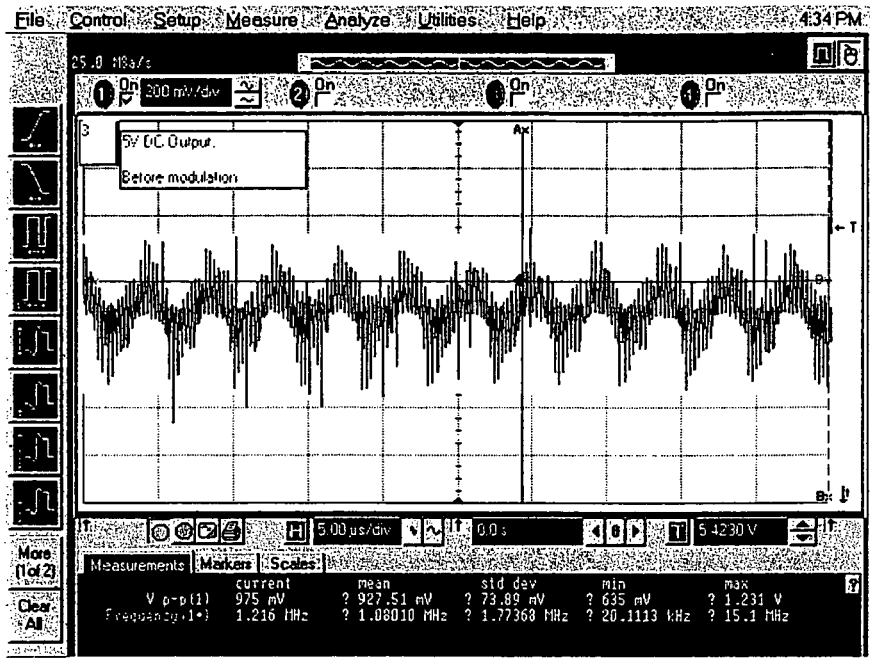
FIG. 12 is an oscilloscope readout showing a regulated voltage derived from an unmodulated PWM signal.
Figure 13:
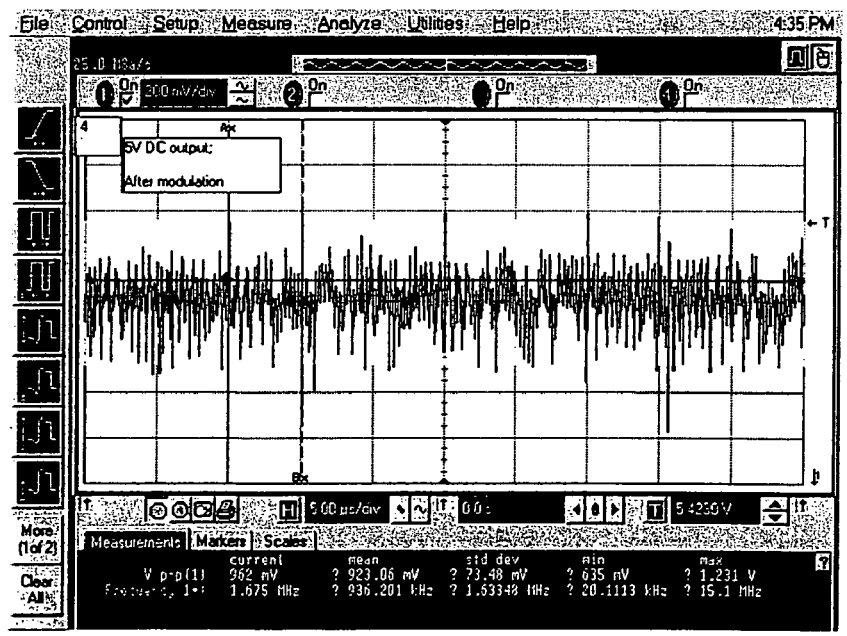
FIG. 13 is an oscilloscope readout showing a regulated voltage derived from a PWM signal modulated in accordance with the present invention.

FIG. 12 depicts the voltage waveform of a regulated power supply fed by an unmodulated PWM signal, and FIG. 13 depicts the voltage waveform of the same power supply when driven by a PWM signal modulated in accordance with the present invention. The output voltage resulting from the modulated PWM signal is in no way degraded by the modulated input, and actually appears to be somewhat smoother than with the unmodulated PWM signal.

Figure 14:
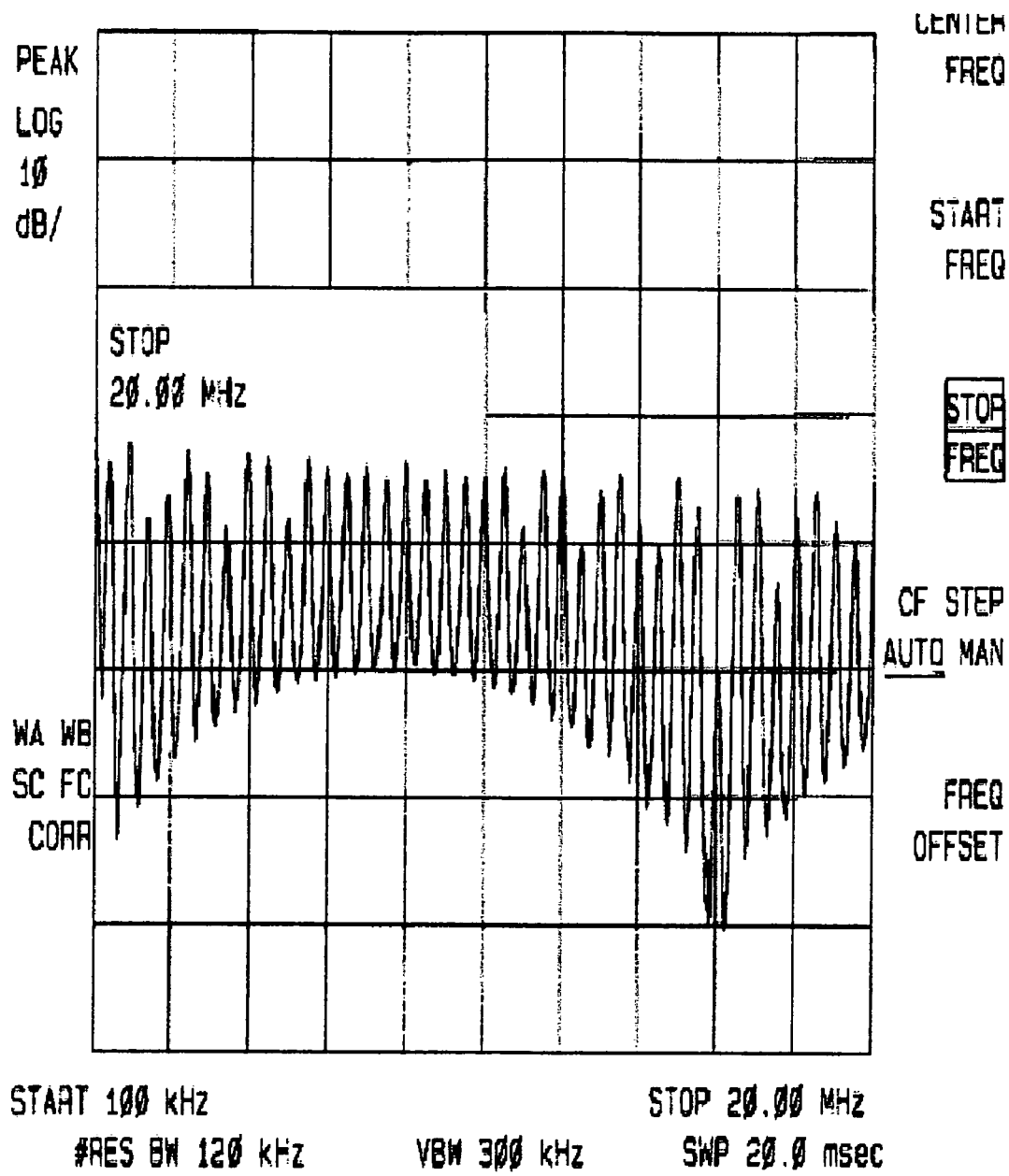
FIG. 14 is another oscilloscope trace showing the EM spectrum of a PWM waveform without the spread spectrum method applied thereto.
Figure 15:
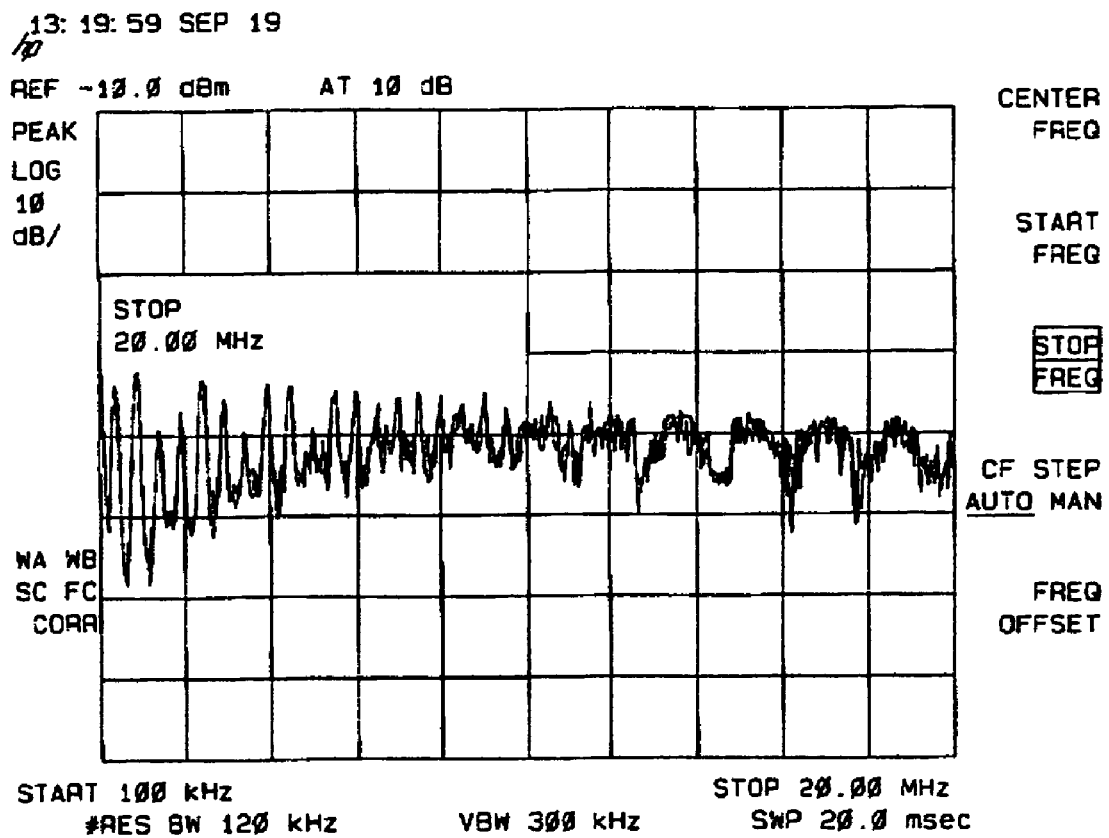
FIG. 15 is an oscilloscope trace showing the EM spectrum of a PWM waveform modulated in accordance with the present invention.

FIGS. 14 and 15 depict another comparison of PWM spectra. A PWM signal that is not modulated by SS techniques exhibits the typical spikes shown in FIG. 14, whereas the application of the SS techniques described herein results in the spectrum of FIG. 15. Note that the spectrum of FIG. 15 is substantially lower in amplitude, and that there are more numerous but much smaller spikes in the spectrum. This spectrum is far more likely to fall within the stringent EMI standards for electronic devices.

The embodiment described above may be modified by the addition of an adaptive retiming arrangement that increases the ability of the invention to operate successfully on very high duty cycle and very low duty cycle PWM signals. That is, when the PWM signal has a very high duty cycle, the pulse off/on transitions will be closely spaced in time; likewise, a very low duty cycle will have pulse on/off transitions that are closely spaced. If these temporal spacings are approximately the same or less than the period of the carrier signal (hereinafter the clock signal), the invention may fail to apply the SS FM process to the PWM signal, and the narrow PWM pulse will not be detected (will be missed).

Figure 16:
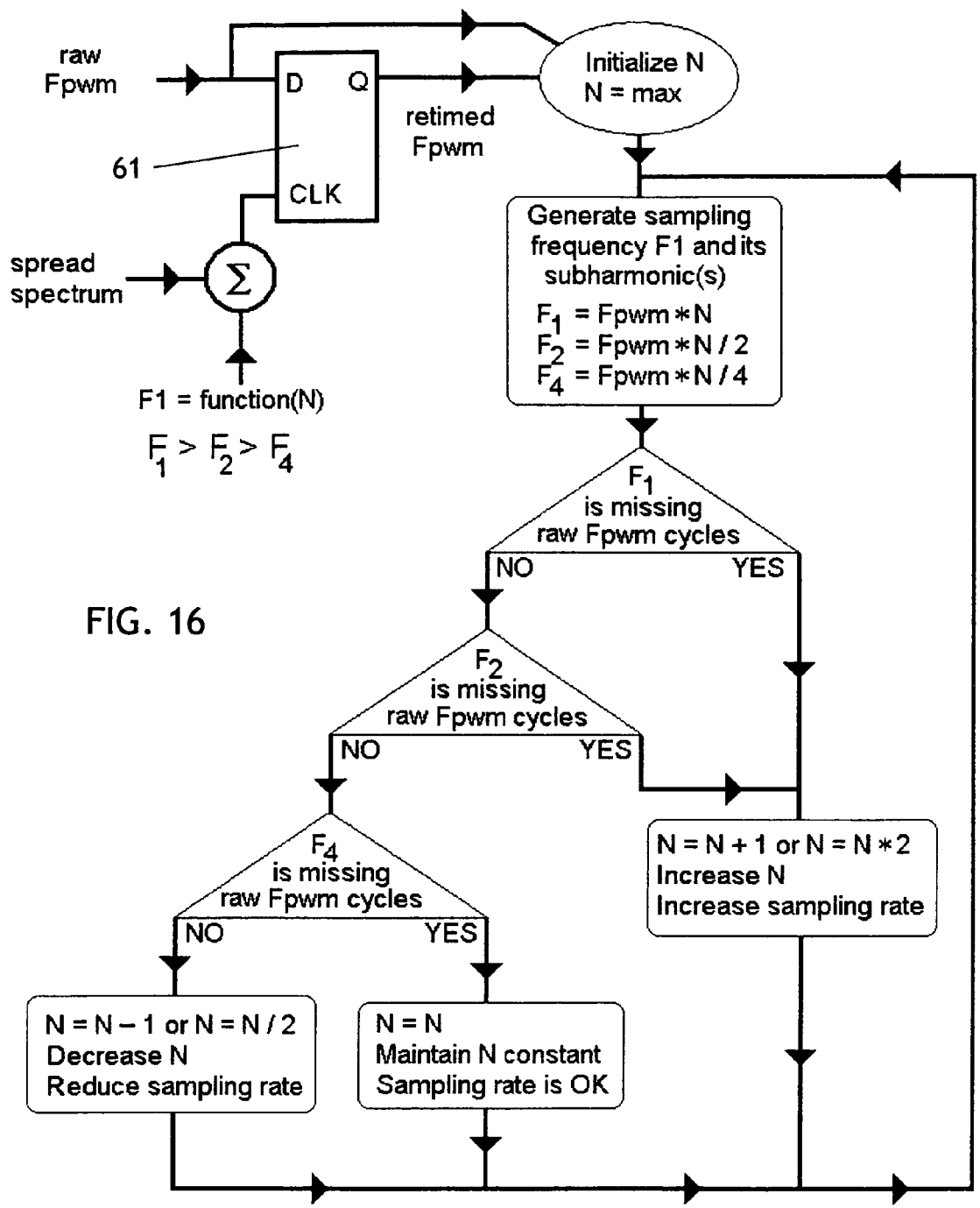
FIG. 16 is a functional block diagram of a further embodiment of the invention employing adaptive retiming of the FM clock signal.

With regard to FIG. 16, a flip-flop 61 receives the raw PWM signal at its D input, and is clocked by a signal that is the sum of the SS signal and a function $F_1=f(N)$. Initially N is set to a maximum value and is used to set $F_1=F_{pwm}N$. If $F_1$ is missing (that is, failing to resolve) raw PWM cycles, then the system increases N to N+1, thus increasing the sampling rate, and the system reiterates. If $F_1$ is not missing raw PWM cycles, then the system shifts to $F_2=F_{pwm}(N/2)$, and checks if the system misses raw PWM cycles at $F_2$. If yes, the system increases the frequency to N=NU2 and reiterates. If $F_2$ is not missing raw PWM cycles, then the system shifts to $F_4=F_{pwm}(N/4)$ and checks for missing PWM cycles. If yes, N=N and the sampling rate is acceptable; if not, N=N−1 or N=N/2 to decrease the sampling rate.

Figure 17:
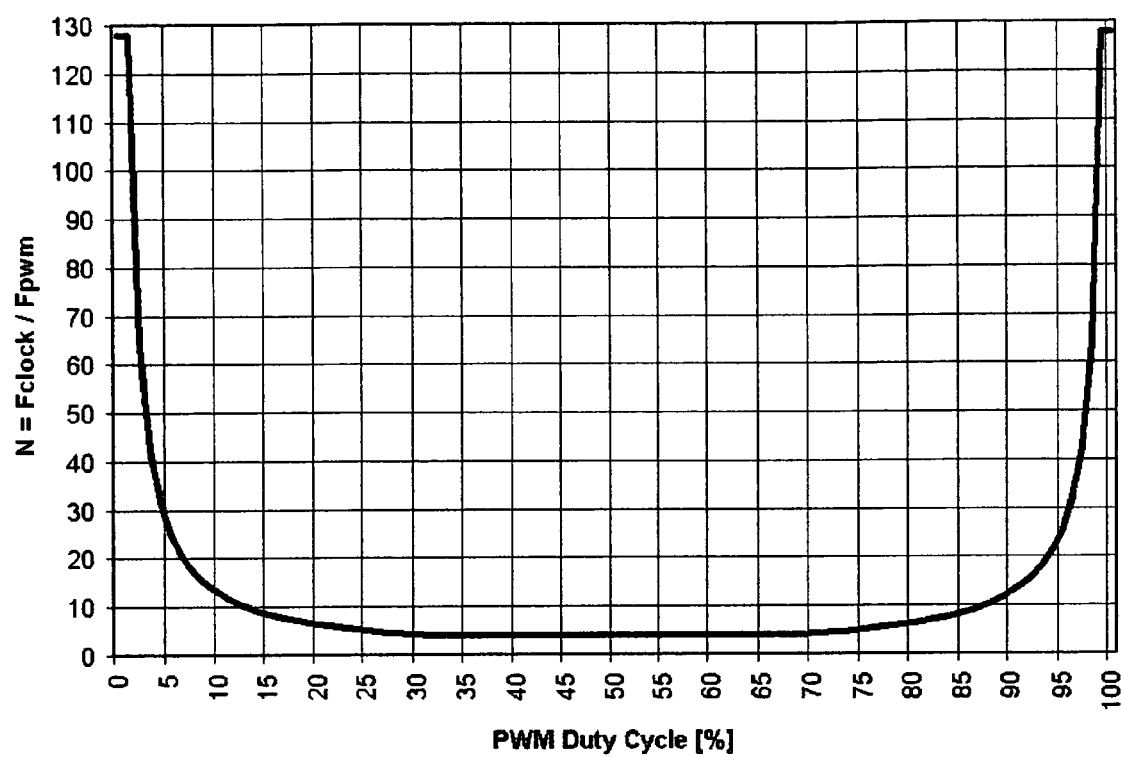
FIG. 17 is a graph depicting the ratio Fclock/Fpwm versus PWM duty cycle for the adaptive retiming embodiment of FIG. 16.

The result of this routine is that the clock frequency is higher than the PWM frequency by at least a factor of two, which is the Nyquist limit. Thus the minimum value of the instantaneous, adaptive clock frequency must sample twice the narrowest PWM pulse or PWM gap. The consequent relationship of $N=F_{clock}/F_{pwm}$ versus PWM duty cycle is depicted in FIG. 17, and shows clearly that the clock frequency increases abruptly at very high and very low duty cycles. Note that at 50% PWM duty cycle, the minimum clock frequency has to be only 2U (1/0.5)=4 times greater than the PWM frequency. At 1% PWM duty cycle (or 99% PWM duty cycle) the minimum clock frequency has to be 2U (1/0.01)=200 times greater than the PWM frequency. Spread spectrum-generated amplitude reduction occurs only for the higher order harmonics of the PWM frequency spectrum and for mid-range PWM duty cycles (20% to 80% duty for example). Spread spectrum-generated amplitude reduction is not effective at the very narrow or very wide PWM duty cycles (below 20% or above 80% duty cycle, for example), since here the adaptive clock frequency is so high that the SS effect (of PWM-pulse-edges lead/lag moving within one clock cycle only) is barely noticeable.

Figure 18:
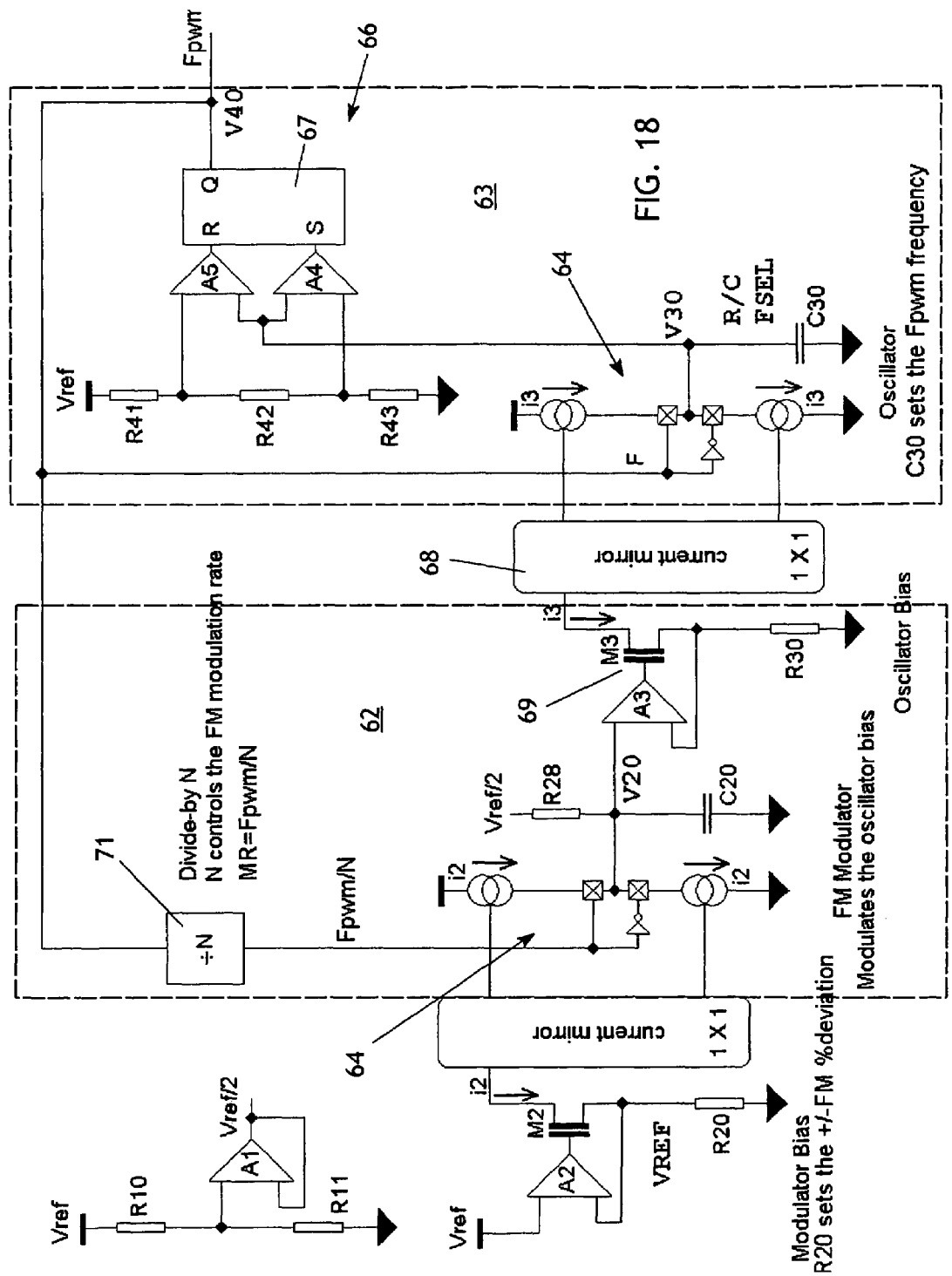
FIG. 18 is schematic block diagram depicting a two oscillator embodiment for SS modulation of a PWM signal.
Figure 19:
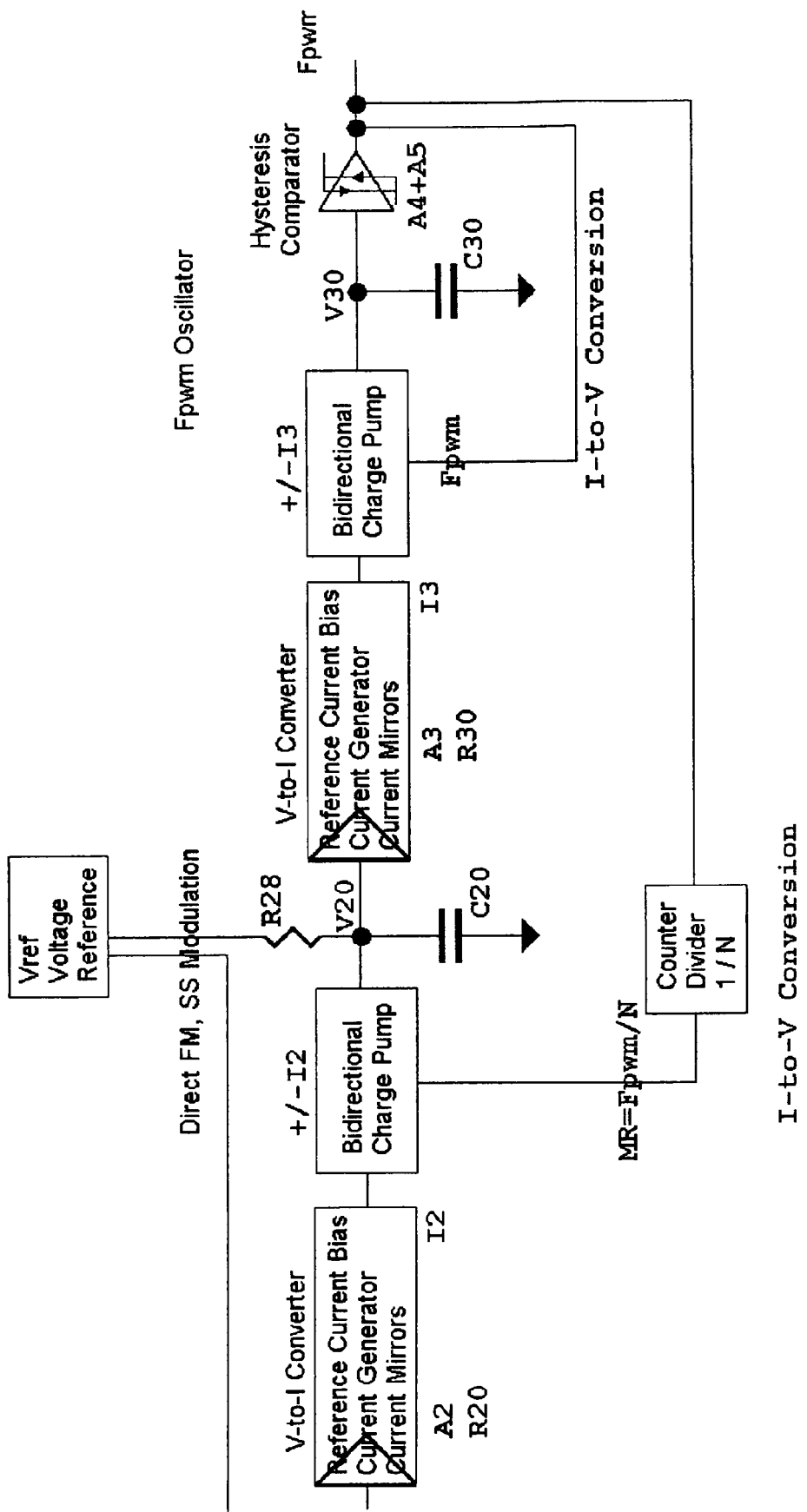
FIG. 19 is a functional block diagram corresponding to the schematic diagram of FIG. 18.

The two oscillator embodiment of the invention, depicted in FIGS. 18 and 19, achieves spread spectrum frequency modulation of a PWM signal through the use of two oscillator circuits 62 and 63 connected in a series arrangement. In this particular implementation the two oscillators are similar. Each oscillator 62 and 63 includes a bi-directional charge pump 64 having an output V20 or V30, respectively. Oscillator 63 includes a hysteresis comparator 66 comprised of flip-flop 67 having the R and S inputs connected to the outputs of op amps A5 and A4, respectively. The joined inputs of the op amps are connected directly to V30, which is also connected through capacitor C30 to ground. The reference levels of the op amps are set by resistor network R41-R43 connected between Vref and ground. Oscillator 63 is configured to generate a triangular or sawtooth PWM signal having a frequency set by the value of C30, which may be adjustable, and by the charge pump bias current, $i_3$.

The charge pump bias current for oscillator 63 is the output of oscillator 62 ($i_3$), so that the output of oscillator 62 frequency modulates the output of oscillator 63. The output of oscillator 62 is delivered through op amp A3, drive transistor 69 and current mirror 68. Op amp A3 output is timed by RC network R28 and C20, and referenced by resistor R30.

In addition, the PWM output is fed back to the charge pump input in oscillator 63 in a current-to-voltage conversion loop. Another feedback loop extends from the PWM output through a programmable÷N counter 71, which feeds the input of charge pump 64 of oscillator 62. Counter 71 modulates the output of oscillator 62, so that a spread spectrum effect is applied to the output PWM signal, and the modulation rate is $NUF_{pwm}$. The output of charge pump 64 of oscillator 62 is fed a modulator bias $i_2$ by op amp A2 through transistor 72 and current mirror 73. In the configuration shown in FIG. 18, R30 and C30 set the PWM center frequency Fpwm, and R20 and C20 set the SS frequency deviation, in the range of 1%-50%. The deviation is constant and independent of temperature and voltage. However, if R20 is infinite (open circuit) the spread spectrum effect is turned off.

The functional aspects of the circuit of FIG. 18 are depicted in FIG. 19. There are two independent variables, $i_2$ and $i_3$. $I_2$ and C20 control the SS FM % deviation, and $i_3$ and C30 control the center frequency $F_{pwm}$. $I_3$=f(V20), and V20=f($i_2$, $F_{pwm}$/N).

Figure 20:
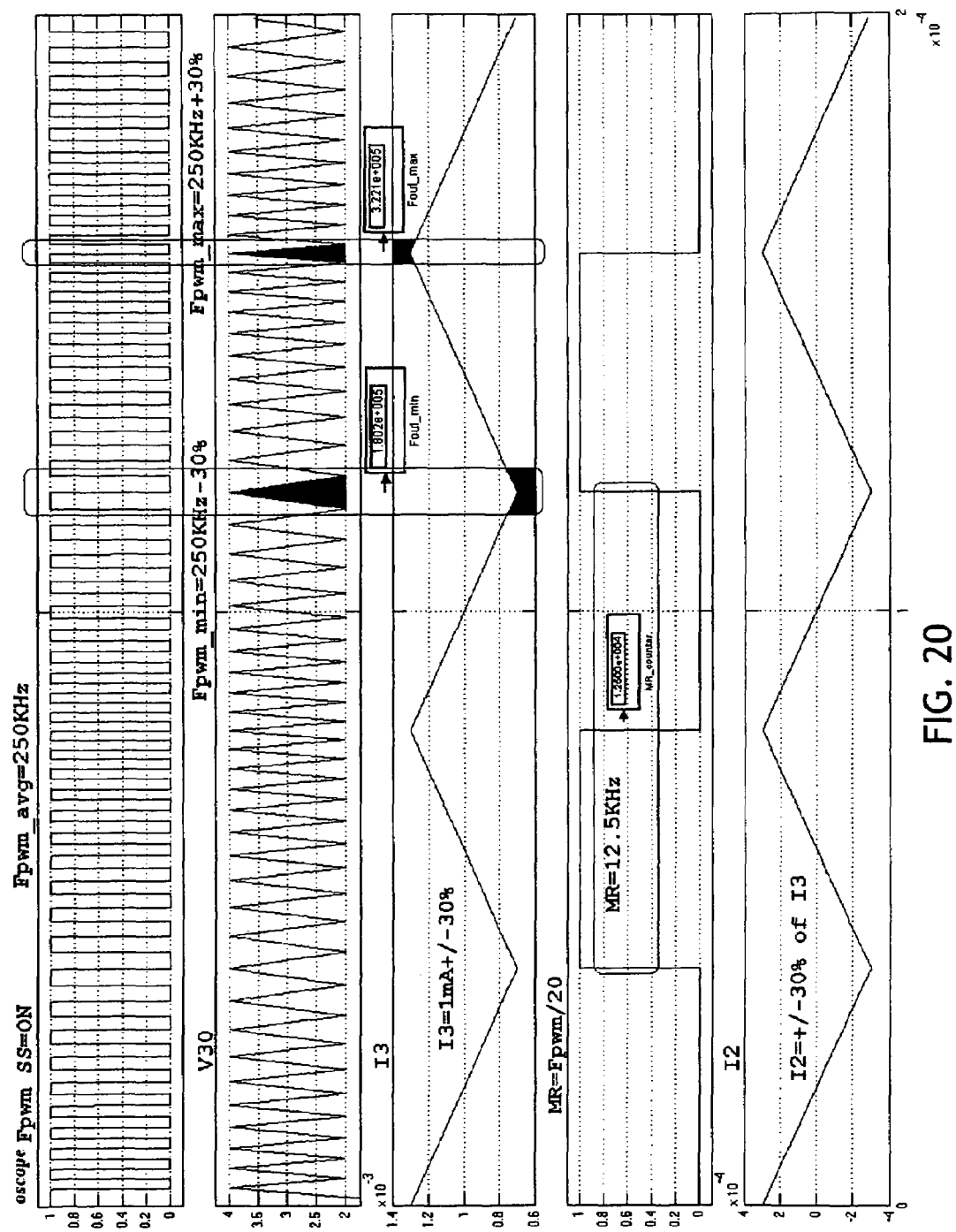
FIG. 20 is a group of coordinated graphs depicting an example of a PWM signal, the SS control voltage, and the resulting SS frequency modulation.
Figure 21:
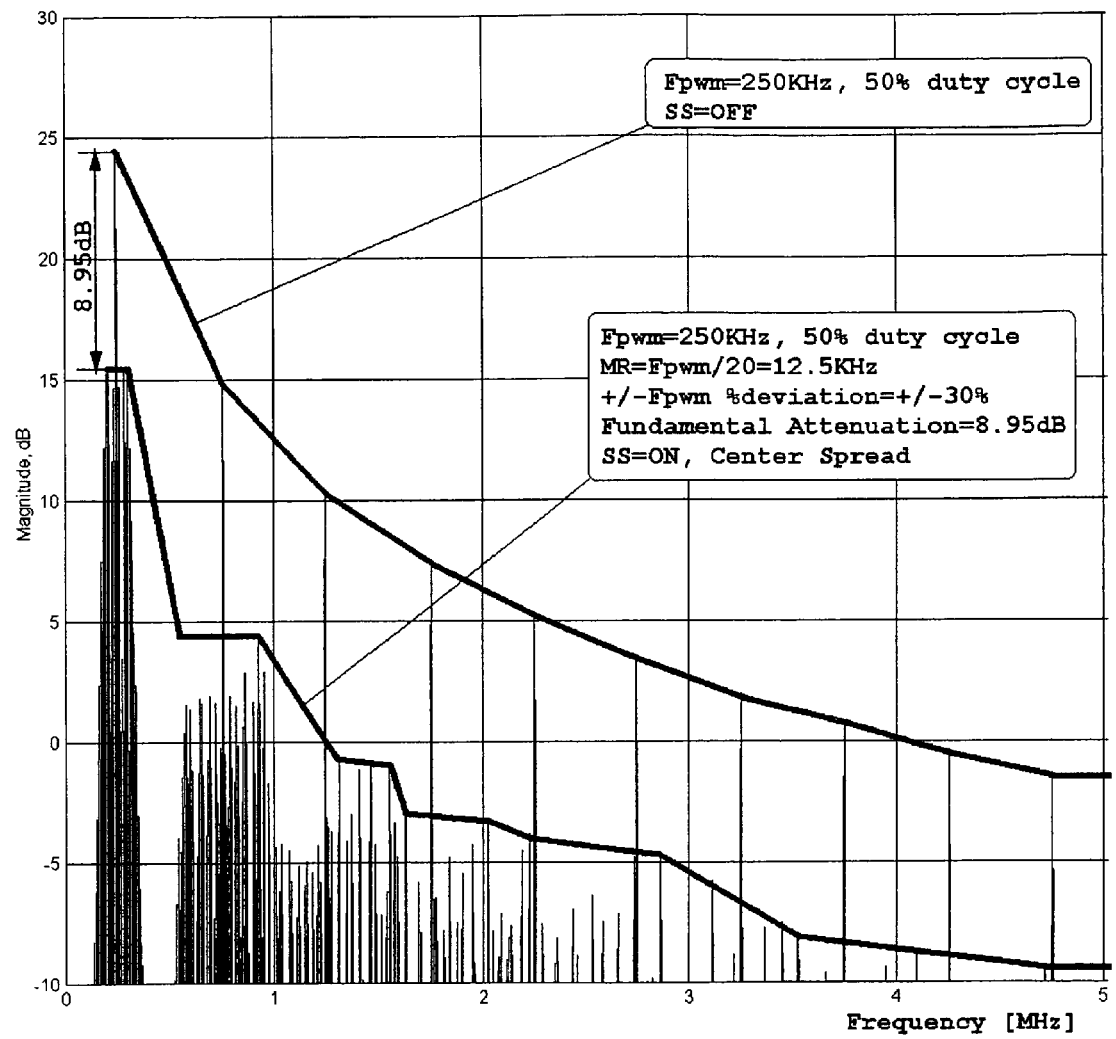

FIG. 20 depicts a typical example of the waveforms generated by the embodiment of FIGS. 18 and 19. The PWM signal is a square wave having an average frequency of 250 KHz, duty cycle of 50%, with a SS deviation of ±30%. The V30 modulation waveform is triangular and center spread, and $i_3$ is a (relatively) slowly varying triangular waveform. N=20 for generating the modulation rate, thus the MR=$F_{pwm}$/20=12.5 KHz. In this example, the observed EMI spectrum, as shown in FIG. 21, indicates attenuation of the fundamental component of 8.95 dB. Note a similar attenuation across a broad spectrum of harmonics, as compared to the SS off condition.

Figure 22:
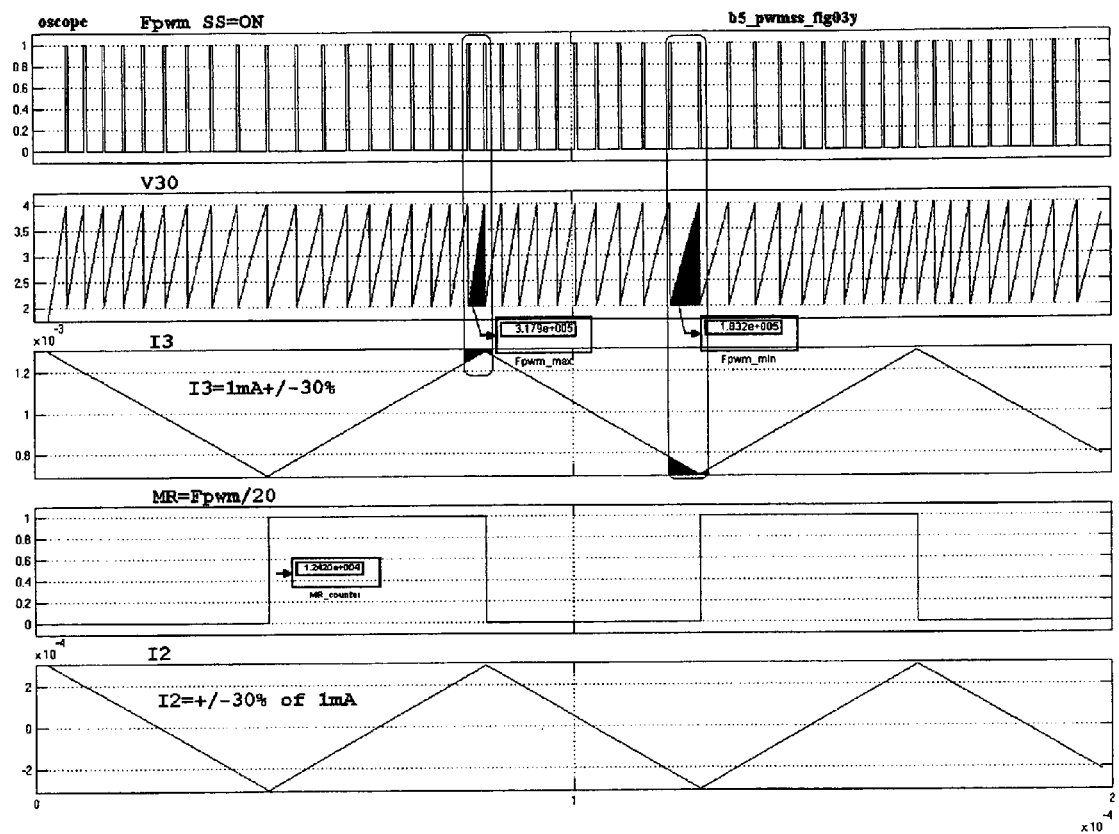
FIG. 22 is a group of coordinated graphs depicting another example of an oscillator to set ON the PWM signal, the SS control voltage, and the resulting SS frequency modulation.
Figure 23:
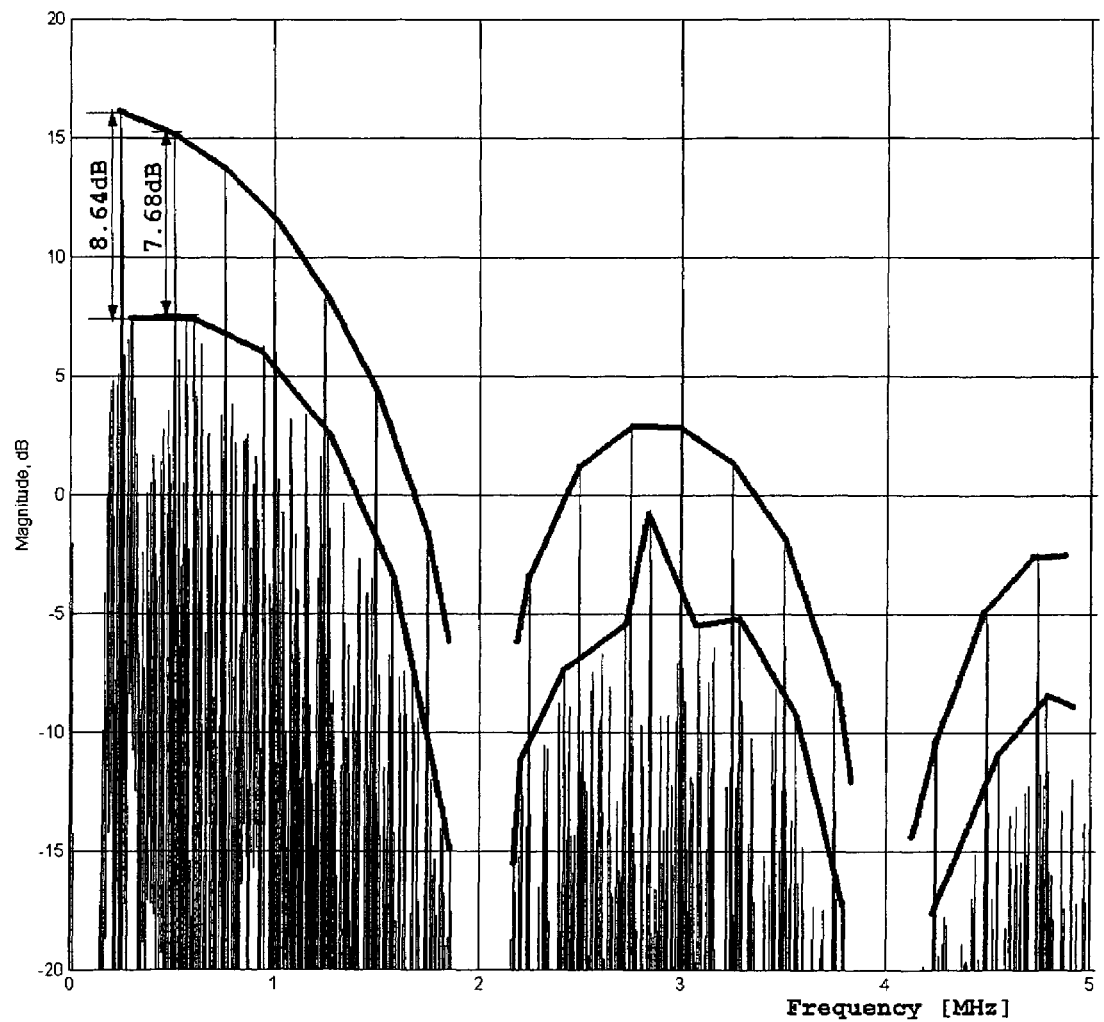

FIG. 22 depicts the waveforms in another example in which $F_{pwm}$=250 KHz, the duty cycle is 12.5% (much less than the previous example), and V30 is a sawtooth waveform. Again N=20, so that the MR=12.5 KHz and the deviation is ±30%. This configuration yields a fundamental attenuation of 8.6 dB, and second harmonic attenuation of 7.7 dB, as shown in FIG. 23. Similar results are achieved for operation at higher frequency ranges, as shown. Note that the setting OFF of the PWM signal is done by classical feedback loop controls, outside the scope of this invention disclosure. Note that for effective PWM fundamental harmonic attenuation, the SS must be introduced in the front stage, at the PWM oscillator itself, not after the oscillator (not in the feedback control loop that actually controls the pulse width/duty cycle for output voltage stabilization).

The embodiment of FIGS. 18 and 19 requires a minimum component count and occupies a concomitant minimal die area. If the two oscillators have same resistive component material (that set the oscillators' bias currents) and same capacitance component material (that set the oscillators' frequencies), then the SS deviation is constant with respect to manufacturing process, voltage fluctuation, and temperature variation.

Figure 24:
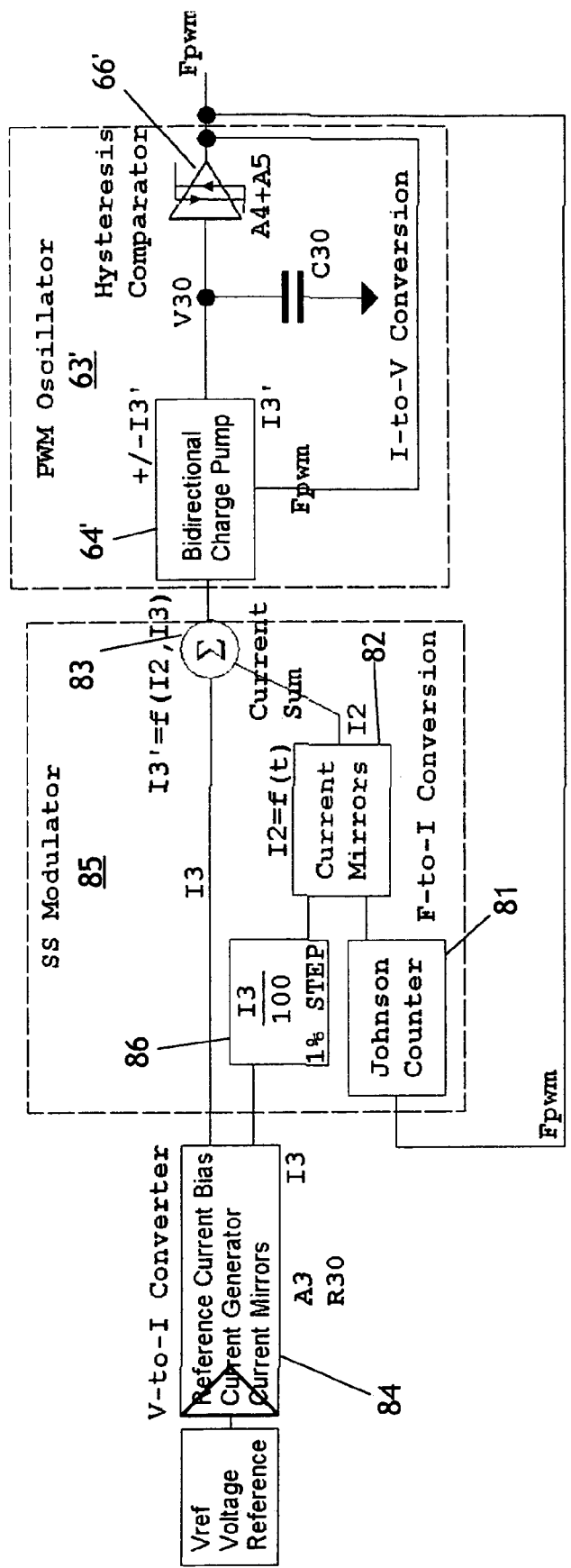
FIG. 24 is a functional block diagram of a single oscillator and counter (Johnson counter) embodiment of the invention for SS FM modulation of a PWM signal.

A further one oscillator embodiment of the invention, shown in FIG. 24, employs some of the same components as the previous embodiment, which are similarly numbered with a prime (') designation. A PWM oscillator 63' includes a bidirectional charge pump 64' having its output connected to a hysteresis comparator 66' which outputs a PWM signal. The charge pump output V30 is connected through capacitor C30 to ground, and a feedback loop extends from the PWM output to the charge pump input. As in the previous embodiment, the PWM output is fed back to the charge pump input in oscillator 63' in a current-to-voltage conversion loop to generate the fundamental PWM signal.

The spread spectrum modulator 85 of the system includes another feedback loop extending from the PWM output through a Johnson counter 81, which performs frequency to current conversion, and thence to current mirrors 82 which produce current $i_2$. $I_2$ is fed to a summing circuit 83 which supplies current to the bidirectional charge pump 64' of oscillator 63'. Summing circuit 83 also receives current $i_3$ from a reference current generator and current mirror block 84. Current source block 84 also supplies current divider 86 which generates a current step function=$i_3$/100, and this current step function is also fed into current mirrors 82 as part of $i_2$, as described below.

Figure 28:
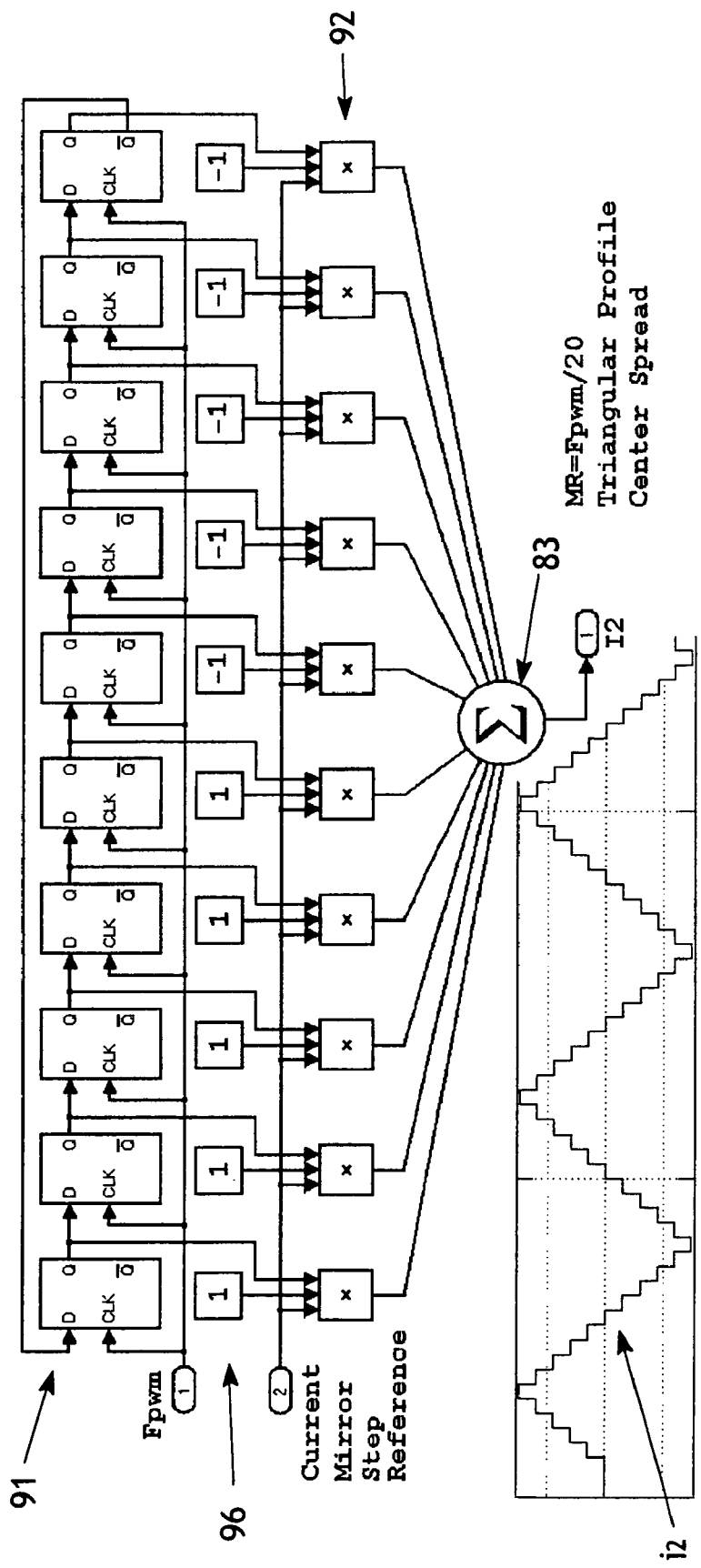
FIG. 28 is a block diagram depicting the Johnson counter generation of a center spread triangular modulation profile using the modular programmed coefficients of the embodiment of FIG. 24.

With reference to FIG. 28, the Johnson counter 81 comprises a plurality of D flip-flops 91 chained together, with the Q output of each FF connected to the D input of the next FF in serial order. Thus each FF is turned on sequentially and remains on. The Q output of the last FF is connected to the D input of the first FF so that each FF is turned off sequentially and remains off. All the FF's are clocked by the PWM signal. In addition, a plurality of current switches 92 are provided, each having an input from a Q output of a respective FF 91, and also having a current step input from a respective current step reference source 96 (which are generated by current divider 86). The outputs of the current switches 92 are fed to the summing device 83, so that the current $i_2$ that is fed to oscillator 63' is a composite comprised of all the outputs of the current switches 92 that are turned on at any one instant. Due to the fact that the FF's 91 are clocked by the PWM signal, it is clear that each PWM pulse switches on another FF 91 and adds the contribution of its respective current step function to the composite output current $i_2$. The result is that $i_2$ is varied over time by the additive effect of the sequential current step functions as the FF's are turned on and remain on, and the subtractive effect as the FF's are turned off sequentially, creating a stepped waveform that is controllable and programmable.

Figure 26:
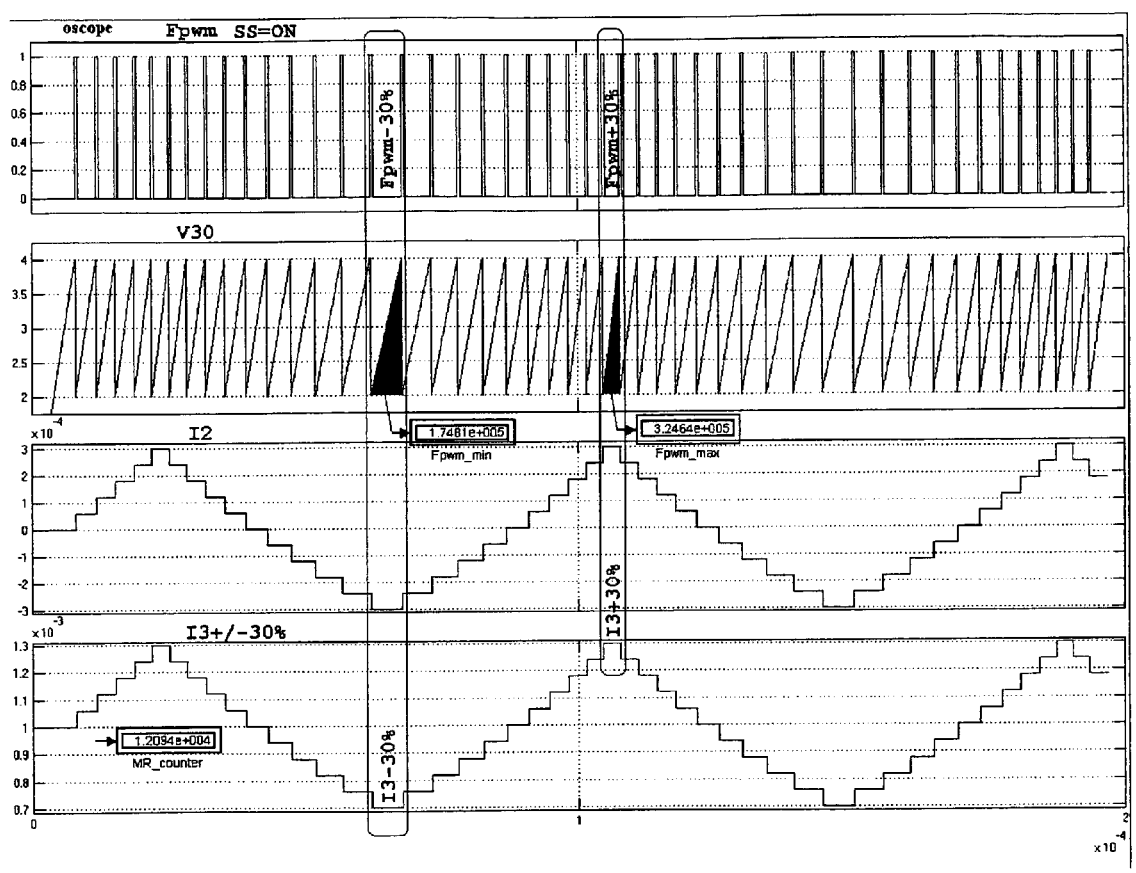
FIG. 26 is a group of coordinated graphs depicting another example of an oscillator for PWM signal, the SS control voltage, and the resulting SS frequency modulation for the embodiment of FIG. 24.

As shown in FIG. 28, assuming that the current step functions are (sequentially) 1, 1, 1, 1, 1, −1, −1, −1, −1, −1, the result is a stepped triangular waveform. Since $i_2$ is the SS modulation driver for PWM oscillator 63', the arrangement of FIG. 28 generates a center spread, triangular modulation profile in the PWM output. In each SS cycle, the SS profile increments for 5 steps, then decrements for 5 steps to return to a (nominal) zero axis, then decrements 5 steps as the first 5 FF's are switched off sequentially, then increments 5 steps as the last 5 FF's are switched off. The cycle then reiterates indefinitely. Note the graphs of FIG. 26, which clearly depict that when the SS profile reaches its minimum the $F_{pwm}$ is lowest, and, vice versa, when the SS profile reaches its maximum the $F_{pwm}$ is at its maximum.

Figure 29:
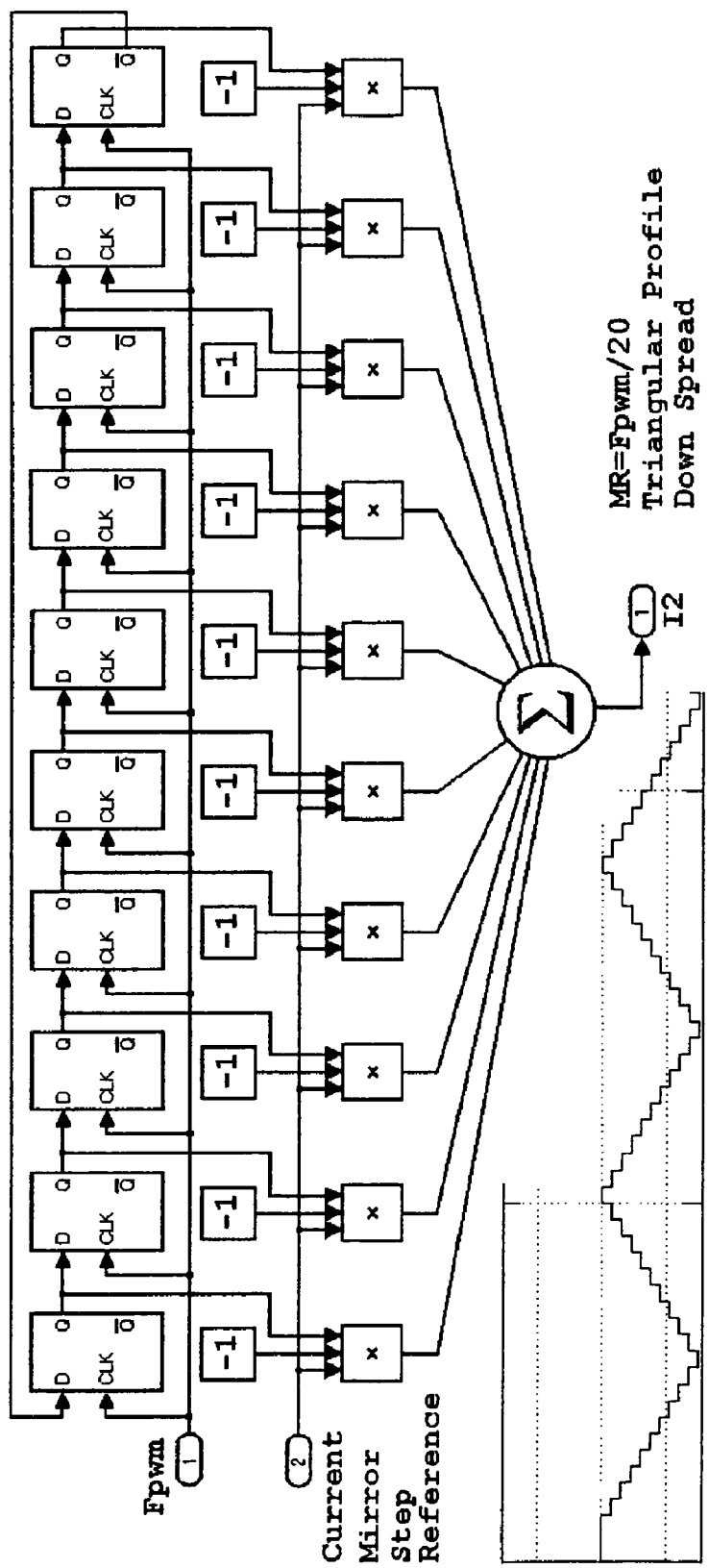
FIG. 29 is a block diagram depicting the generation of a down spread triangular modulation profile using the modular programmed coefficients of the embodiment of FIG. 24.

FIG. 29 depicts the same circuit arrangement as FIG. 28 in which the current step sources 96 are all −1, resulting in a downspread, triangular SS profile. Thus the PWM frequency will vary periodically by dropping smoothly below the center frequency, but will not increase above the center frequency.

Figure 27:
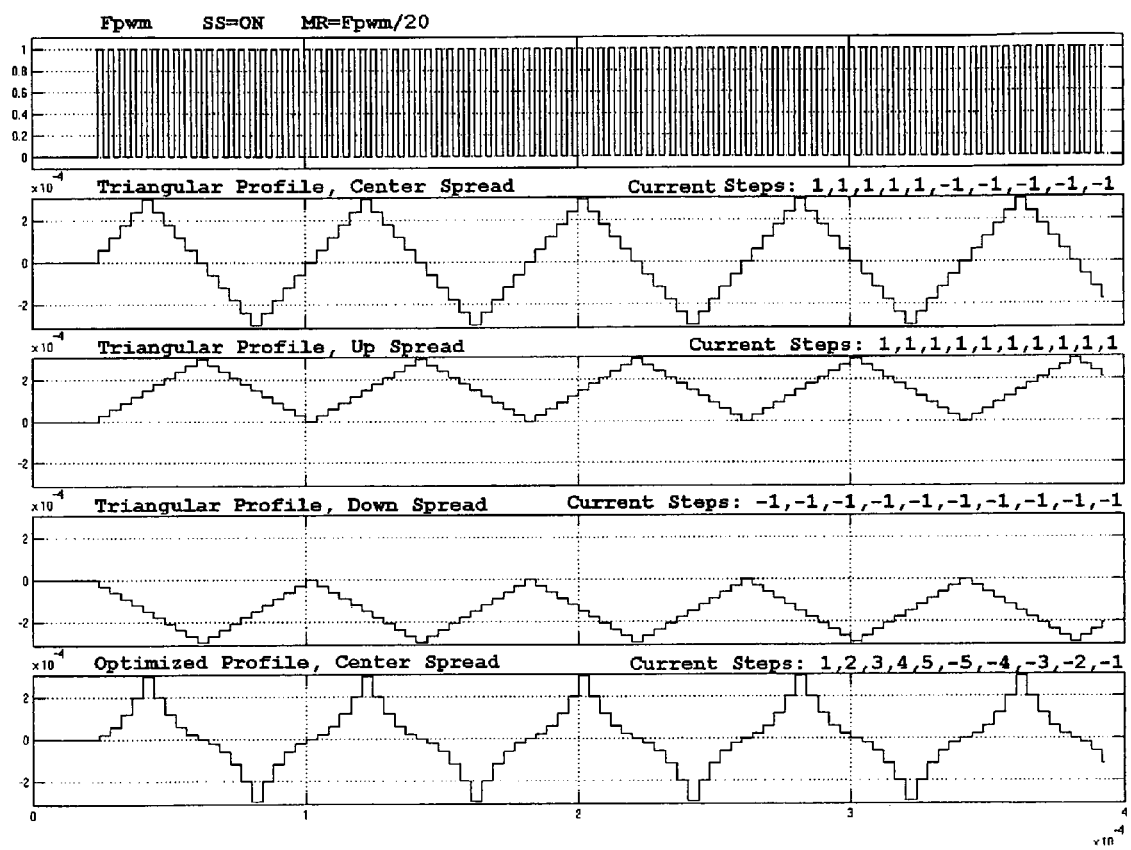
FIG. 27 is a group of coordinated graphs depicting various modulation profiles that may be programmed via the current step coefficients of the embodiment of FIG. 24.
Figure 30:
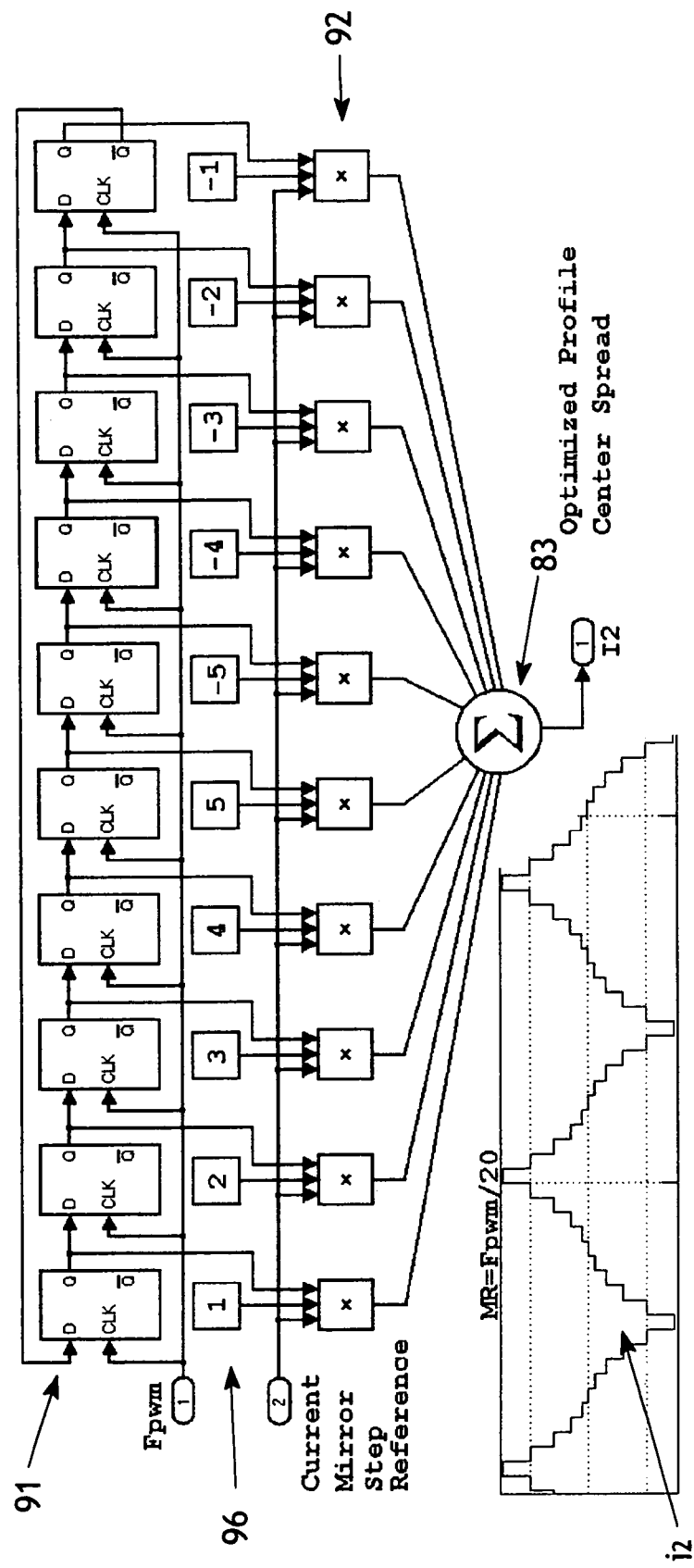
FIG. 30 is a block diagram depicting the generation of a center spread optimized modulation profile using one set of modular programmed coefficients of the embodiment of FIG. 24.

FIG. 30 depicts the same circuit arrangement as FIGS. 28 and 29 in which the current step sources 96 are set to be +1, +2, +3, +4, +5, −5, 4, −3, −2, −1. The resulting SS profile is a triangular, non-linear shape that suppresses fundamental and lower and higher harmonics by eliminating a constant change in frequency. These SS profiles are all shown in the graphs of FIG. 27, together with a triangular upspread profile created by all current sources set at +1. A greater choice of profiles are available, limited only by the number of current sources and their ± integer settings.

Figure 25:
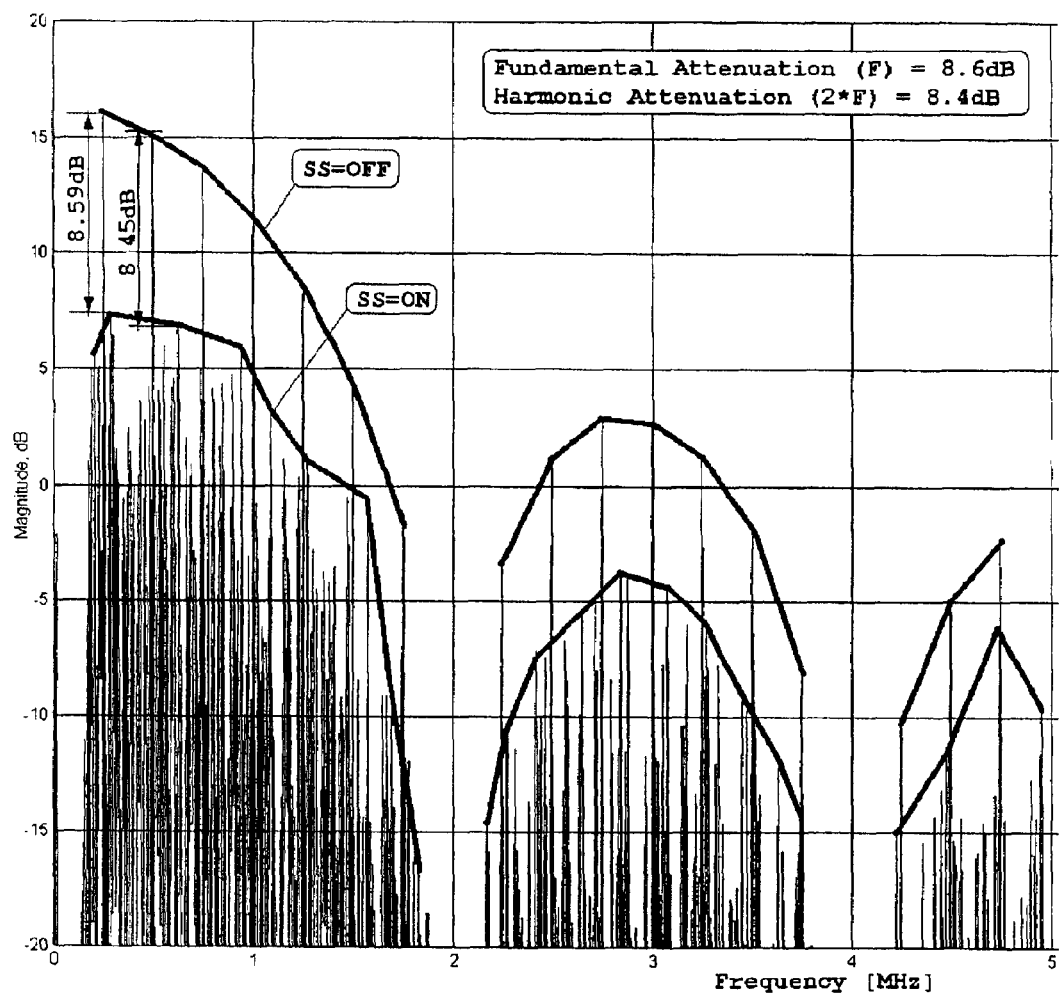
FIG. 25 is a graph of EMI magnitude versus frequency for a typical PWM signal with SS off and SS on, applying the embodiment of FIG. 24, for a wide range of PWM center frequencies.

FIG. 25 depicts a typical spectrum for a PWM waveform, having $F_{pwm}$=250 KHZ, MR=$F_{pwm}$/20, ±deviation=30%, showing the results for SS on and SS off. The attenuation of the fundamental is approximately 8.6 dB, the second harmonic is 8.4 dB down.

Figure 31:
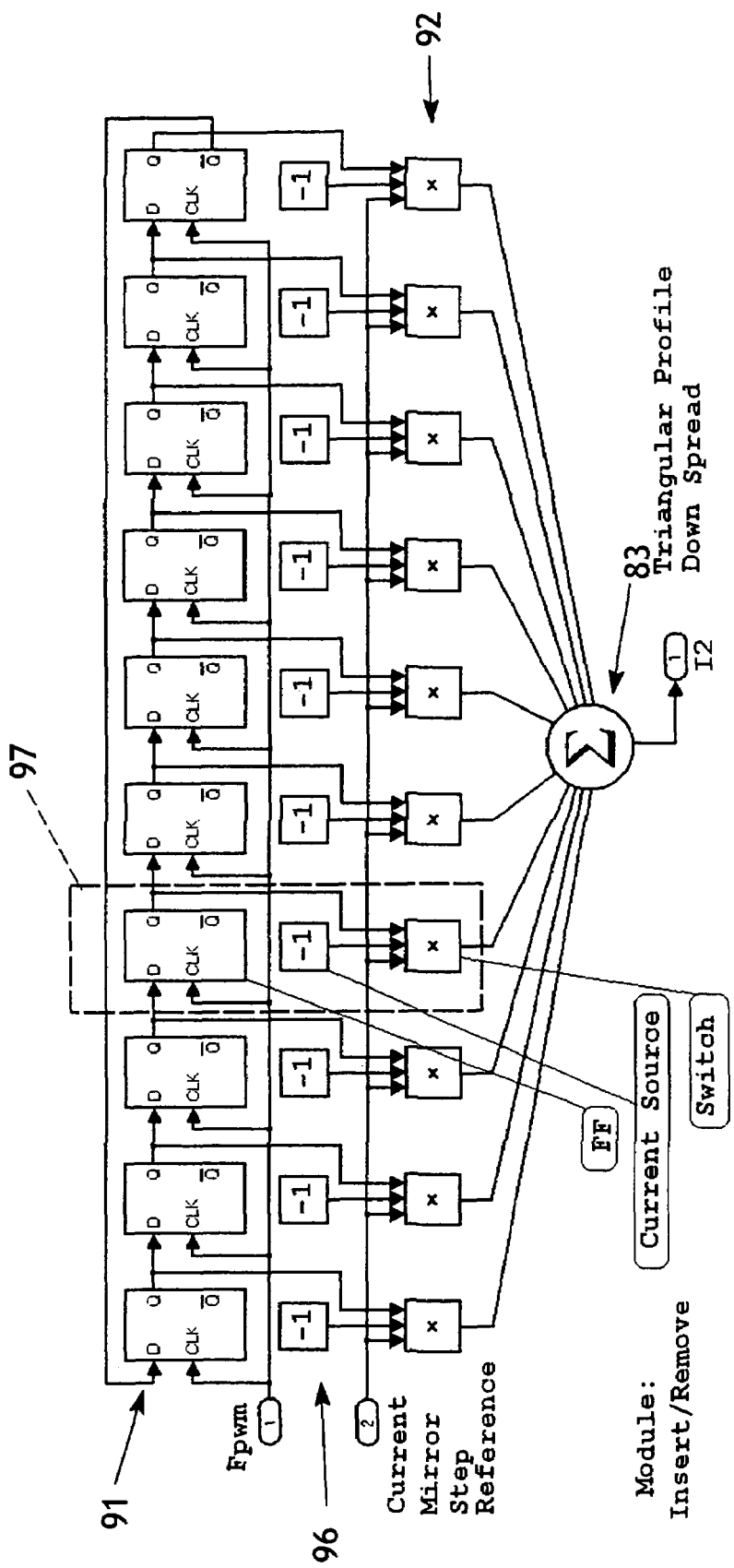
FIG. 31 is a block diagram depicting a more detailed view of the modular construction of the embodiment of FIG. 24.

FIG. 31 depicts a notable advantage of the embodiment of FIGS. 24-30. The SS modulator 85 is by its nature very modular, each module 97 comprised of one flip-flop 91, one current source 96 capable of generating a ±integer current, and one switch 92. These modules 97 may be added or subtracted from the circuit as required to achieve a desired SS profile. This factor creates the opportunity for programming the modulation rate. Moreover, modularity is an aid to manufacturing simplicity when these modules are formed on a die.

Figure 32:
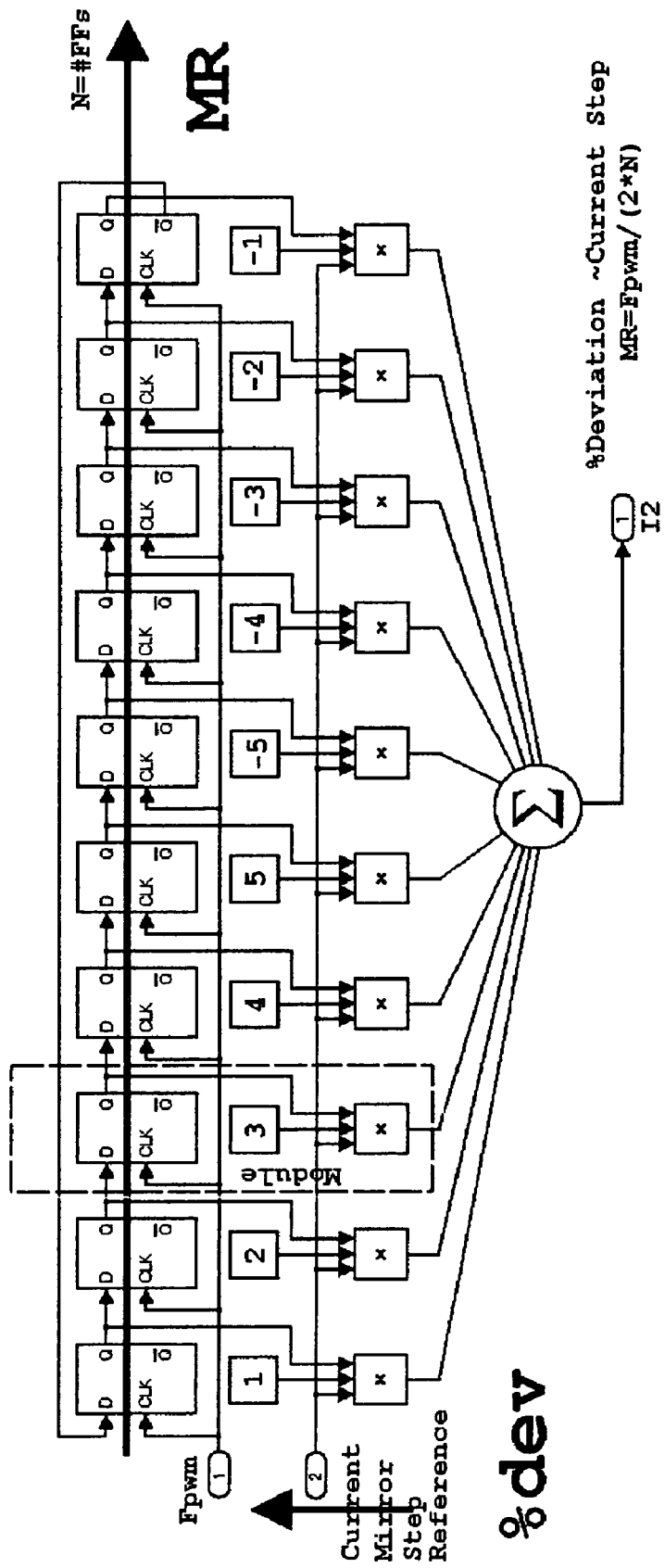
FIG. 32 is a block diagram showing the three dimensional programmability of the embodiment of FIG. 24, and that the number of FFs program the MR, the current mirror step reference programs the % frequency deviation, and the numeric coefficients (multipliers) program the shape of the modulation profile.

With regard to FIG. 32, it should be noted that the embodiment of FIGS. 24-31 has advantageous attributes that are simple and straightforward. The number of modules 97 determines the modulation rate MR, and MR=$F_{pwm}$/2 Unumber of modules. The stepwise current $i_2$ determines the FM deviation, and the current step integers and their signs determine the SS spread type and modulation profile. The current sources 96 may also be programmed to FM % deviation, and to selectively shape the modulation profile. In addition, there are only two analog factors, the current $i_3$ and capacitor C30, operating in the circuit, and all other factors are programmable. The PWM oscillator and the FM modulator are fused into one function block performing current-mode frequency generation and direct, current-mode frequency modulation. The architecture guarantees FM immunity to process, voltage, and temperature variations. Note also that all hysteresis comparator pairs (A4+A5) may be replaced by a single hysteresis comparator and a hysteresis resistor network.

The foregoing description of the preferred embodiments of the invention has been presented for purposes of illustration and description. It is not intended to be exhaustive or to limit the invention to the precise form disclosed, and many modifications and variations are possible in light of the above teaching without deviating from the spirit and the scope of the invention. The embodiments described are selected to best explain the principles of the invention and its practical application to thereby enable others skilled in the art to best utilize the invention in various embodiments and with various modifications as suited to the particular purpose contemplated. It is intended that the scope of the invention be defined by the claims appended hereto.

The invention claimed is:

1. An apparatus for frequency modulating a pulse width modulated signal, including:
    a first oscillator component having a first bi-directional charge pump with an output connected to hysteresis comparator means, a first feedback loop connecting the output of said hysteresis comparator means to an input of said first bi-directional charge pump, said output of said hysteresis comparator means comprising a pulse width modulated signal;
    a second oscillator component connected to an input of said first bi-directional charge pump, a second feedback loop connected from said output of said hysteresis comparator means to an input of said second oscillator component, whereby said second oscillator component is arranged to generate a spread spectrum modulation signal that drives said first oscillator component to generate a spread spectrum, frequency modulated pulse width modulated output;
    wherein said second oscillator component includes a second bi-directional charge pump having an output connected to said first bi-directional charge pump as an oscillator bias current.

2. The apparatus of claim 1, wherein said second feedback loop is connected to an input of said second bi-directional charge pump.

3. The apparatus of claim 1, further including a first current mirror interposed between said output of said second bi-directional charge pump and the input of said first bi-directional charge pump.

4. The apparatus of claim 3, further including a second current mirror connected to the input of said second bi-directional charge pump.

5. The apparatus of claim 1, wherein said second oscillator component generates an oscillator bias current that is fed to said first bi-directional charge pump, said second oscillator including means for varying the oscillator bias current to control a spread spectrum profile of said spread spectrum, frequency modulated pulse width modulated output.

6. The apparatus of claim 5, wherein said means for varying the oscillator bias current includes a plurality of flip-flops connected in serial fashion for sequential operation, a plurality of current switches, each connected to an output a respective one of said flip-flops, plurality of incremental current sources, each connected to a respective one of said current switches, and summing means connected to the outputs of said current switches, whereby actuation of each of said flip-flops causes the respective current switch to connect the respective incremental current source to said summing means.

7. The apparatus of claim 6, wherein said plurality of flip-flops are clocked by the spread spectrum, frequency modulated, pulse width modulated output signal.

8. The apparatus of claim 6, wherein said plurality of flip-flops are D flip-flops with the Q output of each connected to the D input of the serially adjacent flip-flop in chained fashion, and the last flip-flop of the chain has the not Q output connected to the D input of the first flip-flop in the chain, whereby the outputs of the plurality of incremental current sources are added sequentially to the input of the summing means and thereafter subtracted sequentially from the input of the summing means.

9. The apparatus of claim 7, wherein the output of said summing means comprises the oscillator bias current that is fed to said first bi-directional charge pump.

10. The apparatus of claim 6, wherein said plurality of incremental current sources are each set to generate a select positive or negative integer value of current.

11. The apparatus of claim 10, wherein said select positive or negative integer values of current are programmable to select a desired spread spectrum modulation profile.

12. The apparatus of claim 6, wherein the modulation rate of said spread spectrum pulse width modulated signal is $MR=F_{pwm}/2N$, where N=number of said plurality of flip-flops and $F_{pwm}$=a center frequency of the spread spectrum frequency modulated pulse width modulated output.

13. The apparatus of claim 6, wherein each of said flip-flops and its respective incremental current source and its respective current switch comprises a module, and each module may be programmed for selective operation.

14. A method for frequency modulating a pulse width modulated signal, including the steps of:
providing a first oscillator component having a first bi-directional charge pump with an output connected to hysteresis comparator means, connecting a first feedback loop from an output of said hysteresis comparator means to an input of said first bi-directional charge pump so that said output of said hysteresis comparator means comprises a pulse width modulated signal;
connecting a second oscillator component to an input of said first bi-directional charge pump, connecting a second feedback loop from said output of said hysteresis comparator means to an input of said second oscillator component, whereby said second oscillator component is arranged to generate a spread spectrum modulation signal that drives said first oscillator component to generate a spread spectrum, frequency modulated pulse width modulated output;
wherein said second oscillator component is provided with a second bi-directional charge pump having an output connected to said first bi-directional charge pump as an oscillator bias current.

15. The method of claim 14, wherein said second oscillator component is provided with divide-by-N means for dividing the frequency $F_{pwm}$ of the pulse width modulated output signal, whereby the modulation rate of said spread spectrum pulse width modulated signal is $MR=F_{pwm}/2N$.

16. The method of claim 14, further including the step of said second oscillator component generating an oscillator bias current, feeding said oscillator bias current to said first bi-directional charge pump, varying said oscillator bias current to control a spread spectrum profile of said spread spectrum, frequency modulated pulse width modulated signal.

17. The method of claim 16, further including the step of providing a plurality of incremental current sources having selected positive or negative current output values that are delivered to a summing circuit, and sequentially switching on said current sources to modulate said oscillator bias current in stepwise, additive fashion; whereby the stepwise waveform of said oscillator bias current comprises the spread spectrum profile of said spread spectrum, frequency modulated pulse width modulated signal.

* * * * *